United States Patent
Lee

(10) Patent No.: US 8,173,457 B2
(45) Date of Patent: May 8, 2012

(54) METHOD AND APPARATUS FOR MANUFACTURING THIN-FILM TRANSISTOR ARRAY SUBSTRATE

(75) Inventor: Hyung Sup Lee, Suwon-si (KR)

(73) Assignee: JS Lighting Co., Ltd. (KR)

( * ) Notice: Subject to any disclaimer, the term of this patent is extended or adjusted under 35 U.S.C. 154(b) by 0 days.

(21) Appl. No.: 13/056,971

(22) PCT Filed: Aug. 3, 2009

(86) PCT No.: PCT/KR2009/004321
§ 371 (c)(1),
(2), (4) Date: Jan. 31, 2011

(87) PCT Pub. No.: WO2010/013985
PCT Pub. Date: Feb. 4, 2010

(65) Prior Publication Data
US 2011/0143470 A1  Jun. 16, 2011

(30) Foreign Application Priority Data
Aug. 1, 2008 (KR) .................. 10-2008-0075662

(51) Int. Cl.
*H01L 21/00* (2006.01)
(52) U.S. Cl. ............ 438/30; 438/34; 438/147; 438/158; 438/E21.561; 257/40; 257/59; 349/43
(58) Field of Classification Search .................. 438/30, 438/38, 149, 151–166; 257/40, 59, 72, 79; 349/43; 345/99
See application file for complete search history.

(56) References Cited

U.S. PATENT DOCUMENTS

| | | |
|---|---|---|
| 7,532,267 B2 | 5/2009 | Chae et al. |
| 7,741,646 B2 * | 6/2010 | Kang et al. ........... 257/72 |
| 7,824,940 B2 | 11/2010 | Chae et al. |
| 7,927,899 B2 * | 4/2011 | Lee et al. ............ 438/30 |
| 2004/0125254 A1 | 7/2004 | Chae et al. |
| 2008/0165110 A1 | 7/2008 | Kim et al. |
| 2009/0233391 A1 | 9/2009 | Chae et al. |

FOREIGN PATENT DOCUMENTS
KR  10-0557499 B1  3/2006
(Continued)

OTHER PUBLICATIONS

Joon Youp Lee; "TFT Array Substrate and a Manufacturing Method Thereof for Solving a Problem that a Contrast Ratio is Deteriorated by Leakage Light Generated in a Contact Hole Area Even in a Black Screen"; Korean Patent Abstracts; Publication No. 1020080062647 A; Publication Date: Jul. 3, 2008; Korean Intellectual Property Office, Republic of Korea.

(Continued)

*Primary Examiner* — Dung A. Le
(74) *Attorney, Agent, or Firm* — The Law Offices of Andrew D. Fortney; Andrew D. Fortney

(57) ABSTRACT

A method and apparatus of fabricating a thin film transistor array substrate is disclosed, which is capable of reducing fabrication time owing to a simplified fabrication process, wherein at least one of steps for forming a gate pattern, forming a semiconductor pattern, forming a data pattern, removing an ohmic contact layer pattern exposed between source and drain electrode patterns, and forming a conductive layer pattern is performed by a laser scribing process.

20 Claims, 20 Drawing Sheets

FOREIGN PATENT DOCUMENTS

| | | |
|---|---|---|
| KR | 10-2006-0108945 A | 10/2006 |
| KR | 10-2008-0062647 A | 7/2008 |
| KR | 10-2008-00064531 A | 7/2008 |

OTHER PUBLICATIONS

Jeong Il Kim, Seung Soo Baek, Chang Soo Lee and Min Cheol Lee; "Gate Driving Circuit, Liquid Crystal Display Device with the Same, and Manufacturing Method of Thin Film Transistor Array Panel, Capable of Preventing Static Electricity Occurring in a Pixel Region from Being Introduced in the Gate Driving Circuit"; Korean Patent Abstracts; Publication No. 1020080064531 A; Publication Date: Jul. 9, 2008; Korean Intellectual Property Office, Republic of Korea.

Taek Ahn, Min Chul Suh and Jae Bon Koo; "Method for Manufacturing Thin Film Transistor (TFT) Using Laser Beam Irradiation and TFT Manufactured Thereby"; Korean Patent Abstracts; Publication No. 1020060108945 A; Publication Date: Oct. 18, 2006; Korean Intellectual Property Office, Republic of Korea.

Gi Seong Chae and Yong Seop Hwang; "Liquid Crystal Display and Method for Manufacturing the Same"; Korean Patent Abstracts; Publication No. 1020040062108 A (corresponding to Korean Patent No. 10-0557499); Publication Date: Jul. 7, 2004; Korean Intellectual Property Office, Republic of Korea.

International Search Report of International Searching Authority; International Application No. PCT/KR2009/004321, Dated Mar. 17, 2010; 5 pages; International Searching Authority/Korean Intellectual Property Office, Republic of Korea.

* cited by examiner

FIG.15

| gate material forming part | gate material pattern forming part | gate insulating layer forming part | semiconductor layer forming part | semiconductor layer pattern forming part | data material forming part | data material pattern forming part | ohmic contact layer removing part | passivation layer forming part | contact hole forming part | conductive layer forming part | conductive layer pattern forming part |
|---|---|---|---|---|---|---|---|---|---|---|---|
| 800 | 802 | 804 | 806 | 808 | 810 | 812 | 814 | 816 | 830 | 832 | 834 |

METHOD AND APPARATUS FOR MANUFACTURING THIN-FILM TRANSISTOR ARRAY SUBSTRATE

CROSS REFERENCE TO RELATED APPLICATIONS

This application claims the benefit of the Korean Patent Application No. P2008-0075662 filed on Aug. 1, 2008, which is hereby incorporated by reference as if fully set forth herein.

BACKGROUND OF THE INVENTION

1. Field of the Invention

The present invention relates to a method and apparatus of fabricating a thin film transistor array substrate, and more particularly, to a method and apparatus of fabricating a thin film transistor array substrate, which is capable of reducing fabrication time owing to a simplified fabrication process.

2. Discussion of the Related Art

Generally, a thin film transistor array substrate (hereinafter, referred to as "TFT array substrate") includes a switching device or a thin film transistor, wherein the switching device controls an operation of each pixel in a flat type display device such as a liquid crystal display device or a light-emitting display device, and the thin film transistor drives each pixel in the aforementioned flat type display device.

The thin film transistor is comprised of a gate electrode, a semiconductor layer formed to be insulated from the gate electrode, source and drain electrodes formed to have a channel region on the semiconductor layer, and a pixel electrode formed to be electrically connected with the source electrode.

A process of fabricating the TFT array substrate includes a photolithography process.

The photolithography process is comprised of a photoresist coating process, a drying process, an exposure process, a development process, a heat treatment process, and an etching process.

In order to improve an electrical conductivity between the semiconductor layer (a-Si) and the source/drain electrodes for the fabrication process of the TFT array substrate according to the related art, an ohmic contact layer ($n^+$ a-Si) is additionally formed between the semiconductor layer and the source/drain electrodes. In this case, If the ohmic contact layer is connected between the source and drain electrodes, the ohmic contact layer functions as a conductor, whereby the thin film transistor is not driven. For the fabrication process of the TFT array substrate according to the related art, the ohmic contact layer positioned between the source and drain electrodes (which corresponds to a channel region of the thin film transistor) is removed by a dry etching process after patterning the source and drain electrodes through the use of a wet etching process. During the dry etching process, the source and drain electrodes serve as a mask for etching the ohmic contact layer.

However, the related art method of fabricating the TFT array substrate has the following disadvantages.

First, the fabrication process is complicated and the fabrication time is increased due to the patterning process using photolithography.

Also, since the ohmic contact layer is selectively etched through the dry etching process, an inaccurate etching for the ohmic contact layer may cause a problem of over etching, whereby the semiconductor layer may be damaged due to the over etching.

Due to the damage on the semiconductor layer, the yield of the thin film transistor is lowered.

As the ohmic contact layer is selectively etched by the dry etching process, the increased fabrication time causes deterioration of productivity.

Since the pixel electrode is electrically connected with the source electrode by photolithography, the fabrication process is complicated and the fabrication time is increased, thereby lowering the yield.

SUMMARY OF THE INVENTION

Accordingly, the present invention is directed to a method and apparatus of fabricating a TFT array substrate that substantially obviates one or more problems due to limitations and disadvantages of the related art.

An aspect of the present invention is to provide a method and apparatus of fabricating a TFT array substrate, which is capable of reducing fabrication time by simplifying a fabrication process.

Another aspect of the present invention is to provide a method and apparatus of fabricating a TFT array substrate, which can prevent a semiconductor layer from being damaged.

Additional features and aspects of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, a method of fabricating a TFT array substrate comprises forming a gate material on an entire surface of a substrate; performing a first patterning step to form a gate pattern including a gate line, a gate electrode pattern and a gate pad electrode pattern by patterning the gate material; forming a gate insulating layer on the entire surface of the substrate including the gate pattern; forming a semiconductor material including a semiconductor layer and an ohmic contact layer on the gate insulating layer; performing a second patterning step to form a semiconductor pattern including a semiconductor layer pattern and an ohmic contact layer pattern above the gate electrode pattern by patterning the semiconductor layer and the ohmic contact layer; forming a data material on the entire surface of the substrate including the semiconductor pattern; performing a third patterning step to form source and drain electrode patterns, which are positioned at a predetermined interval from each other and are provided above the data line, the data pad electrode and the ohmic contact layer pattern, by patterning the data material; removing the ohmic contact layer exposed between the source and drain electrode patterns; and forming a passivation layer on the entire surface of the substrate from which the ohmic contact layer exposed between the source and drain electrode patterns is removed, wherein at least one of the step of removing the ohmic contact layer pattern, and the first to third patterning steps is performed by a laser scribing process using a laser beam.

The method further comprises forming a conductive material on the passivation layer; performing a fourth patterning step to form a pixel electrode pattern, a gate pad pattern and a data pad pattern by patterning the conductive material; and performing a first electrical-connection step to electrically connect the pixel electrode pattern with the source electrode pattern, a second electrical-connection step to electrically connect the gate pad pattern with the gate pad electrode pattern, and a third electrical-connection step to electrically connect the data pad pattern with the data pad electrode pattern, wherein at least one of the fourth patterning step, and the first, second and third electrical-connection steps is performed by a laser scribing process using a laser beam.

The method further comprises forming first, second and third contact holes in the passivation layer, wherein the first contact hole is provided to expose the source electrode pattern, the second contact hole is provided to expose the gate pad electrode pattern, and the third contact hole is provided to expose the data pad electrode pattern; forming a conductive material on the passivation layer including the first to third contact holes; and performing a fourth patterning step to form a pixel electrode pattern, a gate pad pattern and a data pad pattern by patterning the conductive material, wherein the pixel electrode pattern is electrically connected with the source electrode pattern through the first contact hole, the gate pad pattern is electrically connected with the gate pad electrode pattern through the second contact hole, and the data pad pattern is electrically connected with the data pad electrode pattern through the third contact hole, wherein at least one of the step of forming the contact hole and the fourth patterning step is performing by a laser scribing process using a laser beam.

At least one of the first to fourth patterning steps is performed so as to pattern a material in a first region to be provided with a predetermined pattern on the substrate through the use of first laser beam with a first width emitted from at least one first laser beam irradiation apparatus, and simultaneously to remove a material from a second region except the first region on the substrate, not to be provided with the predetermined pattern, through the use of second laser beam having a width to be wider than the first width, the second laser beam emitted from at least one second laser beam irradiation apparatus.

In another aspect of the present invention, an apparatus of fabricating a TFT array substrate comprises a gate material forming part for forming a gate material on an entire surface of a substrate; a gate material pattern forming part for forming a gate pattern including a gate line, a gate electrode pattern and a gate pad electrode pattern by patterning the gate material; a gate insulating layer forming part for forming a gate insulating layer on the entire surface of the substrate including the gate pattern; a semiconductor material forming part for forming a semiconductor material including a semiconductor layer and an ohmic contact layer on the gate insulating layer; a semiconductor material pattern forming part for forming a semiconductor material pattern including a semiconductor layer pattern and an ohmic contact layer pattern above the gate electrode pattern by patterning the semiconductor layer and the ohmic contact layer; a data material forming part for forming a data material on the entire surface of the substrate including the semiconductor layer pattern; a data material pattern forming part for forming a data material pattern including a data line, a data pad electrode pattern, a source electrode pattern and a drain electrode pattern by patterning the data material, wherein the source and drain electrode patterns are formed on the ohmic contact layer pattern and provided at a predetermined interval from each other; an ohmic contact layer removing part for removing the ohmic contact layer exposed between the source and drain electrode patterns; and a passivation layer forming part for forming a passivation layer on the entire surface of the substrate from which the ohmic contact layer exposed between the source and drain electrode patterns is removed, wherein at least one of the gate material pattern forming part, the semiconductor material pattern forming part, the data material pattern forming part and the ohimici contact layer removing part forms the corresponding pattern through a laser scribing process using at least one laser beam.

The apparatus further comprises a conductive material forming part for forming a conductive material on the passivation layer; a conductive material pattern forming part for forming a pixel electrode pattern, a gate pad pattern and a data pad pattern by patterning the conductive material; and an electrical-connection performing part for performing a first electrical-connection step to electrically connect the pixel electrode pattern with the source electrode pattern, a second electrical-connection step to electrically connect the gate pad pattern with the gate pad electrode pattern, and a third electrical-connection step to electrically connect the data pad pattern with the data pad electrode pattern, wherein at least of the conductive material pattern forming part and the electrical-connection performing part forms the corresponding pattern through a laser scribing process using a laser beam.

The apparatus further comprises a contact hole forming part for forming first, second and third contact holes in the passivation layer, wherein the first contact hole is provided to expose the source electrode pattern, the second contact hole is provided to expose the gate pad electrode pattern, and the third contact hole is provided to expose the data pad electrode pattern; a conductive material forming part for forming a conductive material on the passivation layer including the first to third contact holes; and a conductive material pattern forming part for forming a pixel electrode pattern, a gate pad pattern and a data pad pattern, wherein the pixel electrode pattern is electrically connected with the source electrode pattern through the first contact hole, the gate pad pattern is electrically connected with the gate pad electrode pattern through the second contact hole, and the data pad pattern is electrically connected with the data pad electrode pattern through the third contact hole, wherein at least one of the contact hole forming part and the conductive material pattern forming part forms the corresponding pattern through a laser scribing process using a laser beam.

At least one of the gate material pattern forming part, the semiconductor material pattern forming part, the data material pattern forming part and the conductive material pattern forming part patterns a material in a first region to be provided with a predetermined pattern on the substrate through the use of first laser beam with a first width emitted from at least one first laser beam irradiation apparatus, and simultaneously removes a material from a second region except the first region on the substrate, not to be provided with the predetermined pattern, through the use of second laser beam having a width to be wider than the first width, the second laser beam emitted from at least one second laser beam irradiation apparatus.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 15 is a block diagram illustrating an apparatus of fabricating a TFT array substrate according to the second embodiment of the present invention.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a method and apparatus of fabricating a TFT array substrate according to the present invention will be described with reference to the accompanying drawings.

Figure 1:
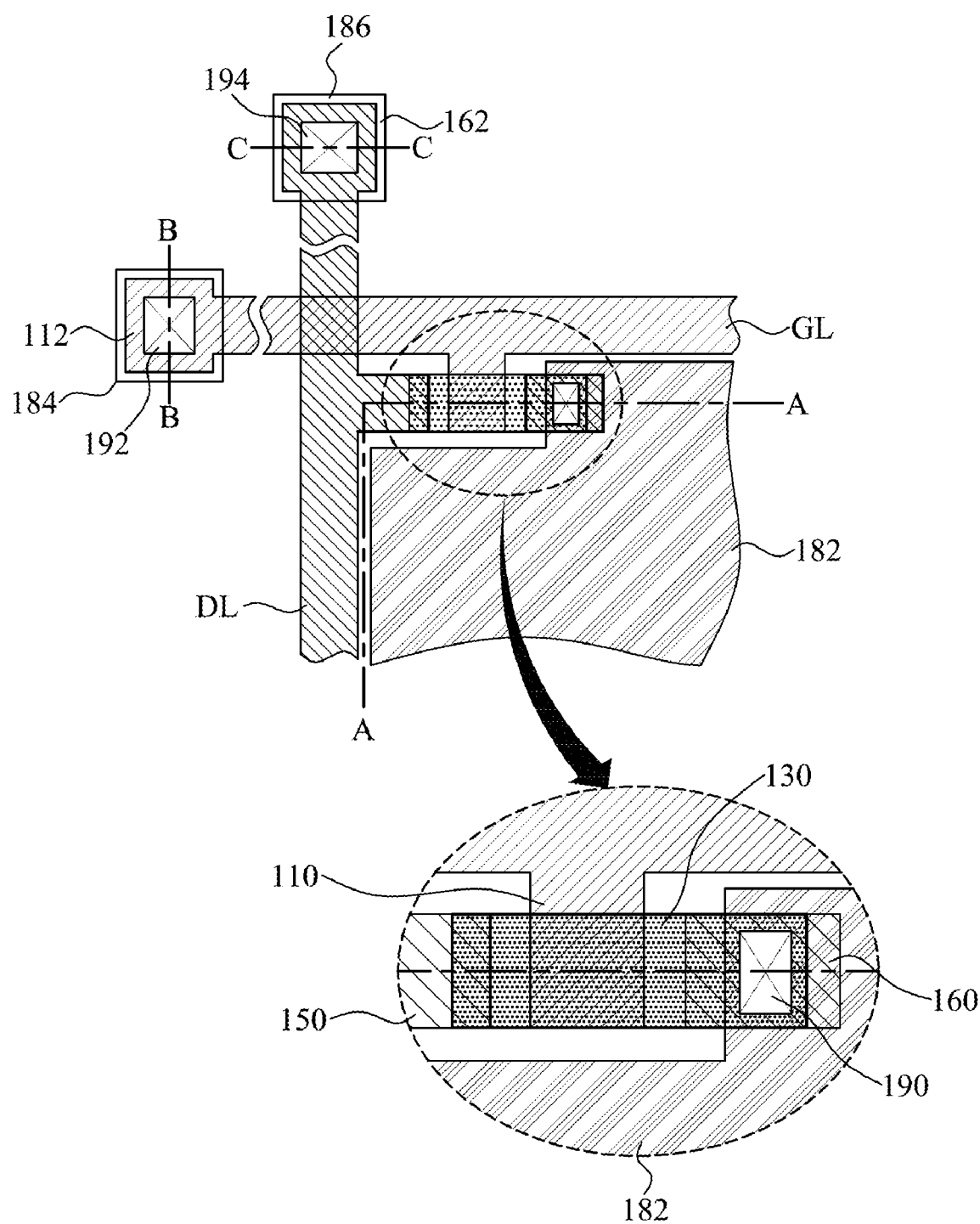
FIG. 1 is a plan view illustrating a TFT array substrate according to the embodiment of the present invention.
Figure 2A:
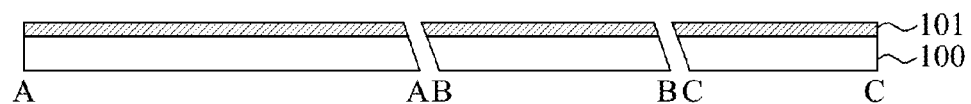
FIGS. 2A to 2P are a series of cross section views illustrating a method of fabricating a TFT array substrate according to the first embodiment of the present invention.

FIG. 1 is a plan view illustrating a TFT array substrate according to the embodiment of the present invention. FIGS. 2A to 2P are a series of cross section views illustrating a method of fabricating a TFT array substrate according to the first embodiment of the present invention.

A method of fabricating a TFT array substrate according to the present invention will be explained with reference to FIGS. 2A to 2P in connection with FIG. 1.

First, a substrate 100 includes a thin film transistor (hereinafter, referred to as "TFT") region (A-A), a gate pad region (B-B), and a data pad region (C-C). In this case, a TFT is formed in the TFT region (A-A); a gate pad electrode pattern 112 for supplying a gate signal to the TFT through a gate line (GL) is formed in the gate pad region (B-B); and a data pad electrode pattern 162 for supplying a data signal to the TFT through a data line (DL) is formed in the data pad region (C-C).

As shown in FIG. 2A, a gate material 101 is formed on an entire surface of the substrate 100. In this case, the substrate 100 may be made of a transparent material, for example, glass or plastic such as PET (Polyethylene Terephthalate), PEN (Polyethylenenaphthelate), PP(Polypropylene), PI(Polyamide) or TAC (Tri Acetyl Cellulose). Preferably, the substrate 100 is made of glass. The gate material 101 may be formed in a single-layered structure or multi-layered structure by using at least one of metal materials such as copper (Cu), copper alloy (Cu Alloy), aluminum (Al), aluminum neodymium (AlNd), molybdenum (Mo), molybdenum alloy, chrome (Cr), chrome alloy, titanium (Ti), titanium alloy, argentums (Ag) and argentums alloy. The gate material 101 may be formed by a metal-material deposition process, for example, sputtering process.

Figure 2B:
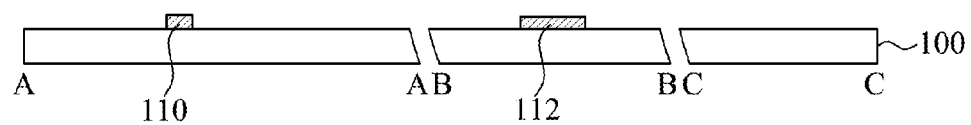

As shown in FIG. 1 and FIG. 2B, the gate material 101 is patterned by a laser scribing process, thereby forming the gate line GL, a gate electrode pattern 110, and the gate pad electrode pattern 112 on the TFT region (A-A) and the gate pad region (B-B). Accordingly, the gate line (GL) is formed at a first direction of the substrate 110; the gate electrode pattern 110 extends from the gate line (GL); and the gate pad electrode pattern 112 is connected with one end of the gate line (GL).

FIGS. 3A to 3G are a series of perspective views illustrating a method of patterning the gate electrode pattern, the gate line, and the gate pad electrode pattern by the laser scribing process according to the embodiment of the present invention.

Figure 3A:
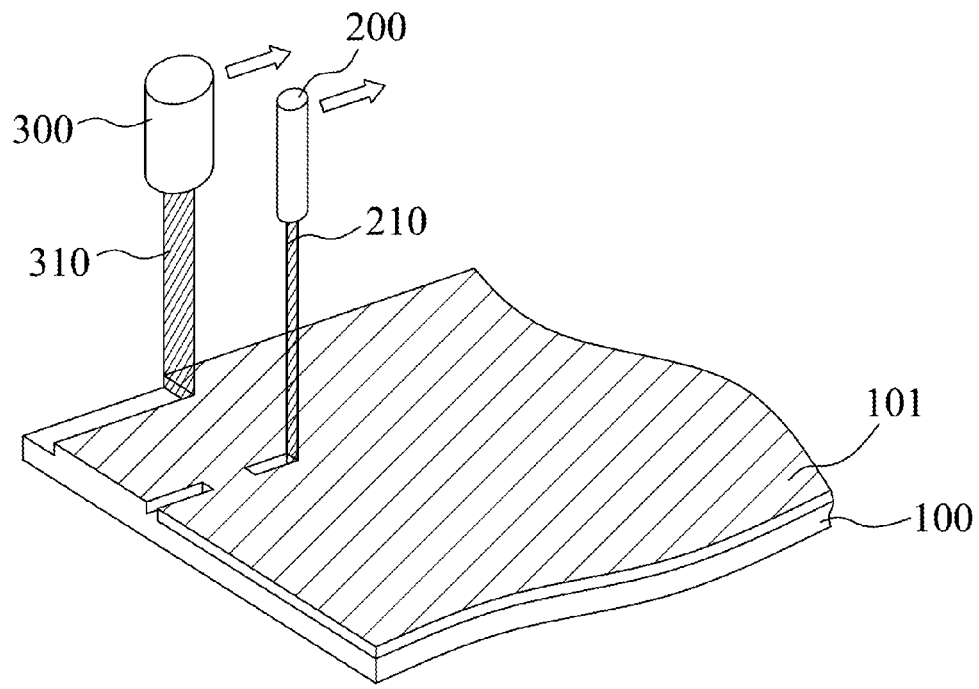
FIGS. 3A to 3G are a series of perspective views illustrating steps of a laser scribing process for fabrication of a TFT array substrate according to the embodiment of the present invention.

First, as shown in FIG. 3A, the gate material 101 corresponding to a first region to be provided with a gate pattern (including the gate electrode pattern, the gate line and the gate pad electrode pattern) on the substrate 100 is patterned by using a first laser beam irradiation apparatus 200; and simultaneously the gate material 101 corresponding to a second region except the first region on the substrate 100 is removed by using a second laser beam irradiation apparatus 300. That is, the first and second laser beam irradiation apparatuses 200 and 300 directly apply first and second laser beams 210 and 310 to the gate material 101 corresponding to the first and second regions while being moved from one side to the other side of the substrate 100. In this case, the first and second laser beam irradiation apparatuses 200 and 300 are moved at the same speed in the same direction.

In more detail, the first laser beam irradiation apparatus 200 directly applies the first laser beam 210 with a first width to the first region of the substrate 100 so that the gate pattern is formed by patterning the gate material 101 in the first region of the substrate 100. Simultaneously, the second laser beam irradiation apparatus 300 directly applies the second laser beam 310 with a second width which is wider than the first width to the second region of the substrate 100 so that the gate material 101 is removed from the second region of the substrate 100, wherein the second region of the substrate 100 indicates the region without the gate pattern. In this case, the first and second laser beams 210 and 310 can remove only the gate material 101 owing to its great selectivity for selectively removing a corresponding singular layer according to power.

The first and second laser beams 210 and 310 may use YLF laser which includes Nd3+ in addition to YLiF4 (YLF) crystal using a solid-phase material as a medium; Nd:YAG laser beam having infrared wavelength of 1064 nm; or H-F laser beam corresponding to Excimer laser using a gaseous medium. Without being limited to the aforementioned kind and intensity of the laser beam, the kind and intensity of the applied laser beams 210 and 310 may be changed based on the kind and thickness of the gate material 101.

Figure 3B:
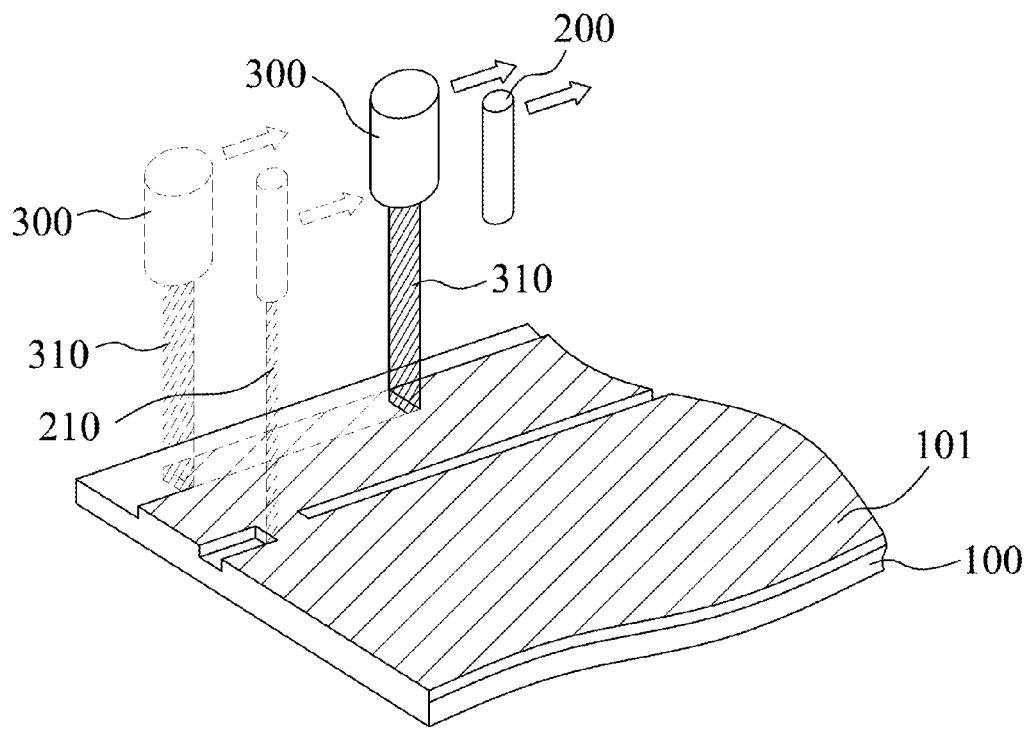

In the meantime, as shown in FIG. 3B, the first laser beam irradiation apparatus 200 is moved without applying the first laser beam 210 to the region corresponding to the shape of the gate pattern.

After completing the removal of the gate material 101 at the first direction of the substrate 100, the first and second laser beam irradiation apparatuses 200 and 300 are restored to their original positions corresponding to one side of the substrate 10.

Then, the first laser beam irradiation apparatus 200 is moved to the second direction perpendicular to the first direction so as to be in correspondence with the shape of the gate pattern, and simultaneously the second laser beam irradiation apparatus 300 is moved from its former position toward the second direction by the second width.

Figure 3C:
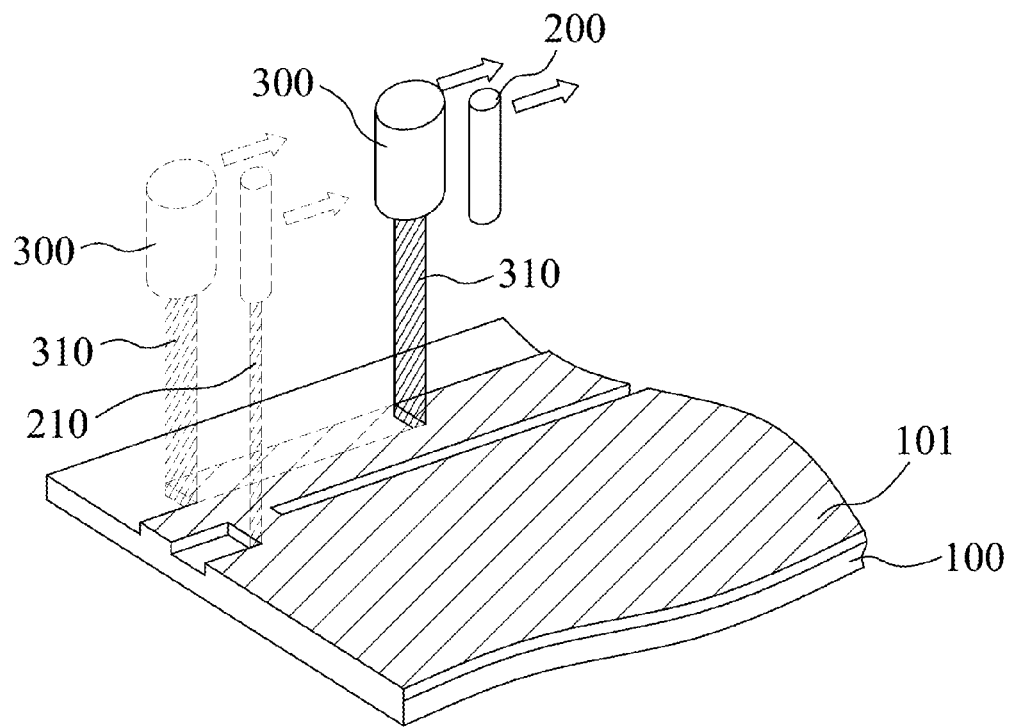
Figure 3D:
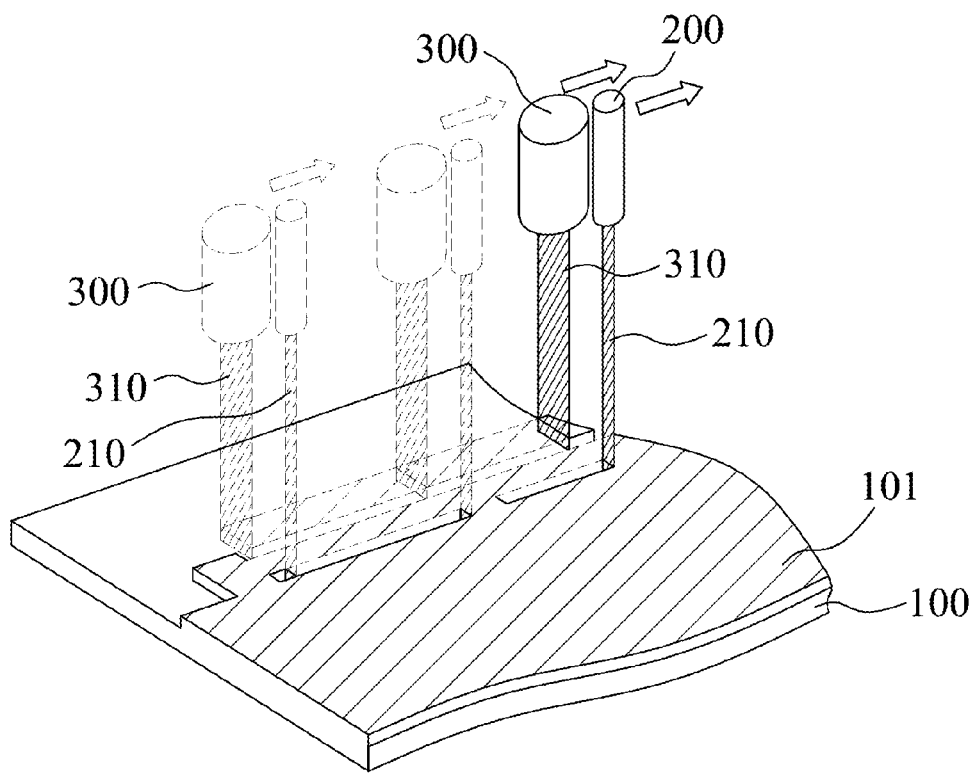
Figure 3E:
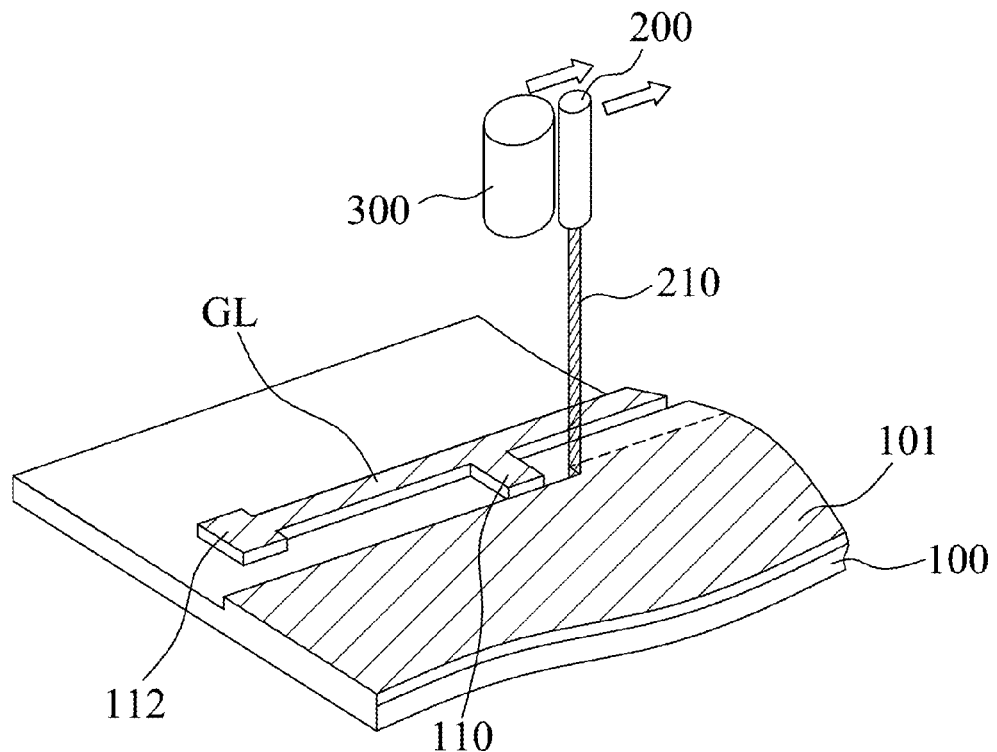

As shown in FIGS. 3C and 3D, the first laser beam irradiation apparatus 200 patterns the gate material 101 while being moved at the first direction of the substrate 100, thereby continuously forming the gate pattern. Simultaneously the second laser beam irradiation apparatus 300 removes the gate material 101 from the second region of the substrate 100. During these processes, if the position of the gate pattern formed by the first laser beam irradiation apparatus 200 overlaps with the second laser beam irradiation apparatus 300, the second laser beam irradiation is moved without applying the second laser beam 310 to the overlapped region, as shown in FIG. 3E.

Figure 3F:
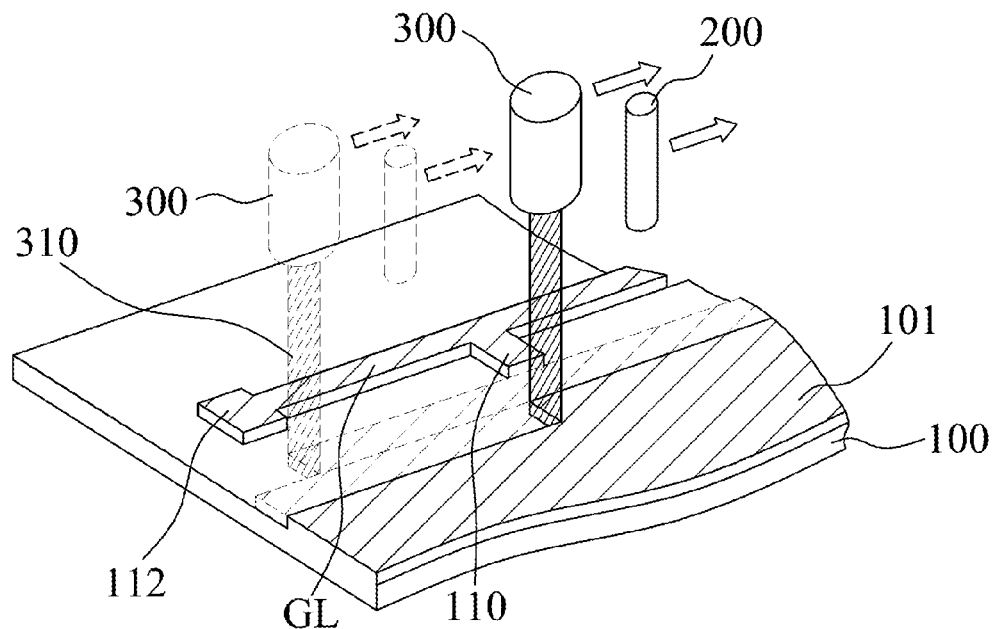

When the gate pattern (GL) 110 and 112 is formed on the substrate 100 by the first laser beam irradiation apparatus 200 as shown in FIG. 3F, the second laser beam irradiation apparatus 300 removes the remaining gate material 101 from the second region of the substrate 100 by applying the second laser beam 310 thereto, as shown in FIG. 1F. In this case, the first laser beam irradiation apparatus 200 is moved without applying the first laser beam 210 to the gate material 101. Since the first and second laser beam irradiation apparatuses 200 and 300 are positioned at a predetermined interval from each other, the first laser beam irradiation apparatus 200 as well as the second laser beam irradiation apparatus 300 can remove the gate material 101 from the second region according to the size of the gate material 101 remaining on the substrate 100.

Figure 3G:
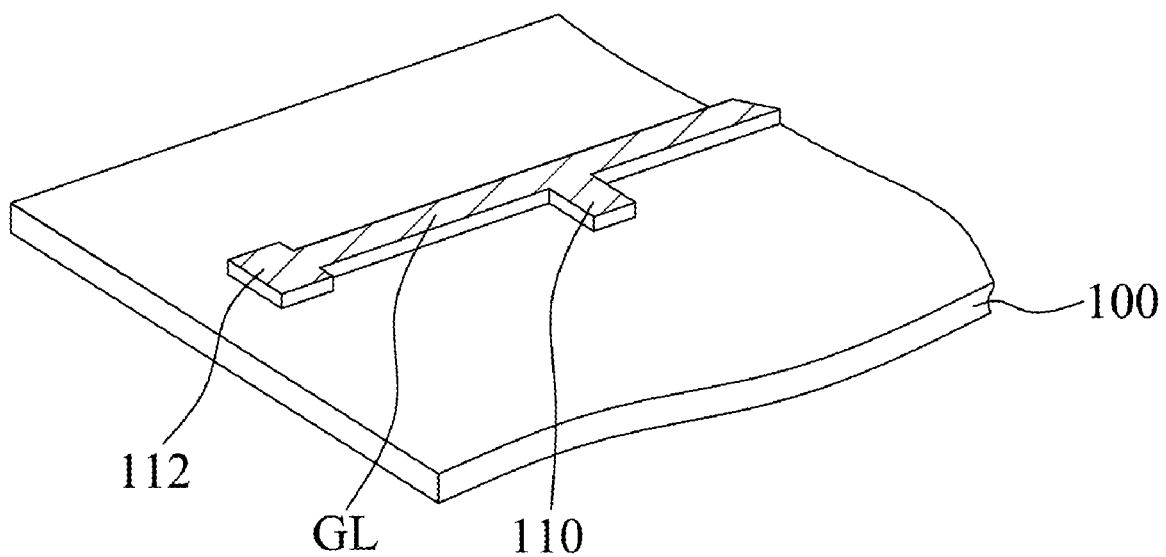

Through the laser scribing process, the gate material 101 of the substrate 100 is patterned and removed simultaneously, to thereby form the predetermined gate pattern (GL) 110 and 112 on the substrate 100, as shown in FIG. 1 and FIG. 3G.

Figure 2C:
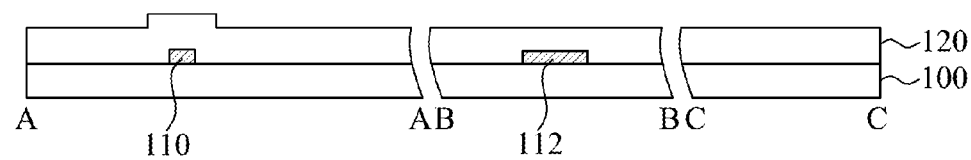

As mentioned above, when the gate pattern (GL, 110 and 112) is formed on the substrate 100 through the laser scribing process as shown in FIG. 2C, a gate insulating layer 120 is formed on an entire surface of the substrate 100 including the gate line (GL), the gate electrode pattern 110, and the gate pad electrode pattern 112. At this time, the gate insulating layer 120 may be formed of an inorganic material, for example, silicon nitride (SiNx) or silicon oxide (SiOx).

Figure 2D:
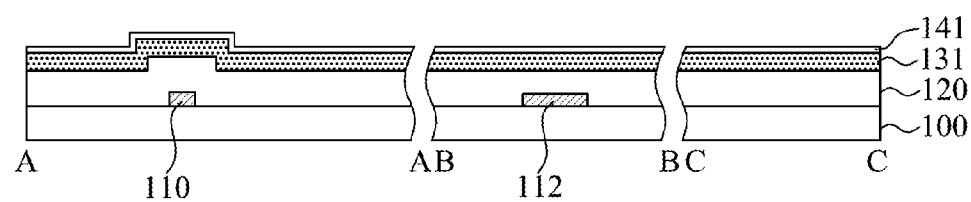

As shown in FIG. 2D, a semiconductor layer 131 and an ohmic contact layer 141 are sequentially formed on the gate insulating layer 120 above the gate electrode pattern 110. In this case, the semiconductor layer 131 and the ohmic contact layer 141 may be formed on the entire surface of the gate insulating layer 120 by PECVD (Plasma Enhanced Chemical Vapor Deposition).

Figure 2E:
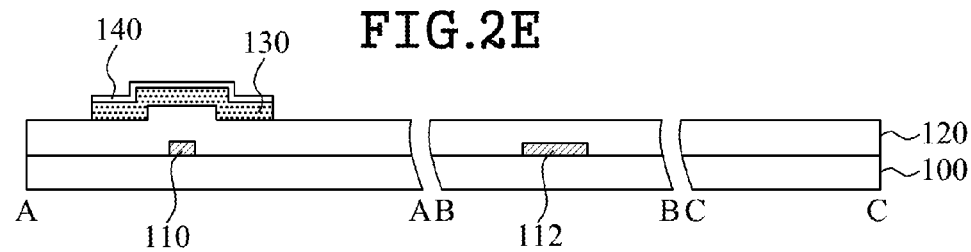

According as the semiconductor layer 131 and the ohmic contact layer 141 are patterned sequentially or simultaneously by the aforementioned laser scribing process explained with reference to FIGS. 3A to 3G, a semiconductor layer pattern 130 and an ohmic contact layer pattern 140 are formed in the region above the gate electrode pattern 110, as shown in FIG. 2E.

Figure 2F:
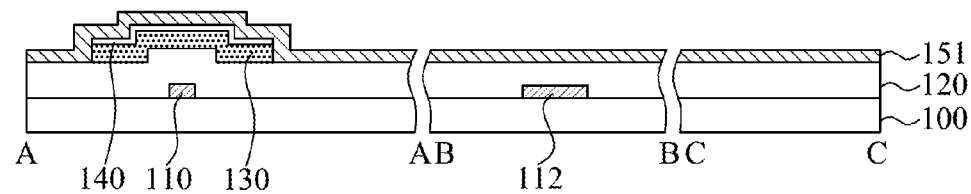
Figure 2G:
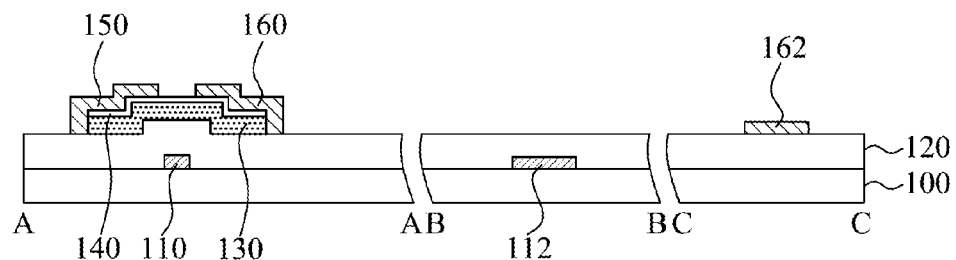

As shown in FIG. 2F, a data material 151 is formed on the entire surface of the substrate 100 including the semiconductor layer pattern 130 and the ohmic contact layer pattern 140. At this time, the data material 151 may be formed of at least one of metal materials such as molybdenum (Mo), nickel (Ni), chrome (Cr) and tungsten (W). The data material 151 may be formed on the entire surface of the substrate 100 by a metal-material deposition process such as a sputtering process.

The data material 151 is patterned by the laser scribing process explained with reference to FIGS. 3A to 3G, thereby forming the data line (DL), source and drain electrode patterns 160 and 150 on the ohmic contact layer pattern 140, and the data pad electrode pattern 162. In this case, the source and drain electrode patterns 160 and 150 are positioned at a predetermined interval from each other.

Figure 2H:
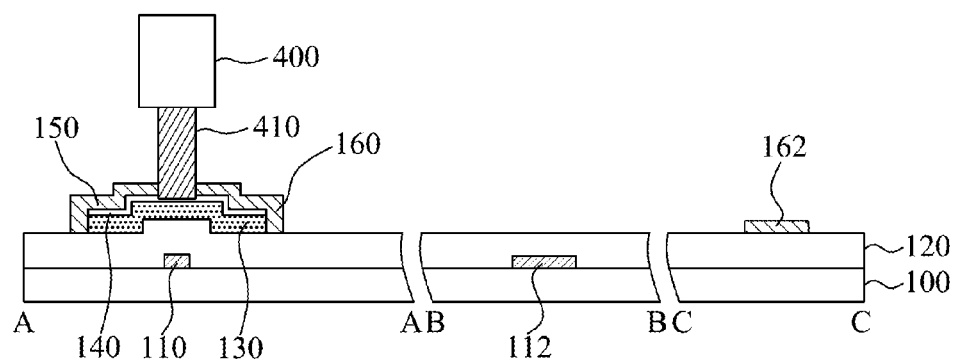
Figure 2I:
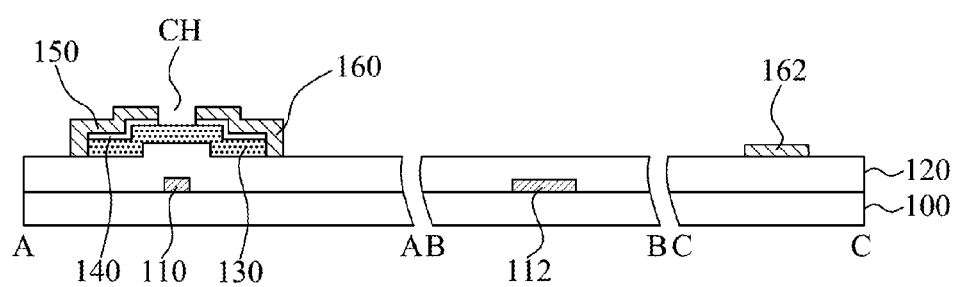

As shown in FIG. 2H, a predetermined portion of the ohmic contact layer pattern 140, which is exposed in a channel region (CH) of thin film transistor between the source electrode pattern 160 and the drain electrode pattern 150, is irradiated at least once with a third laser beam 410 emitted from a third laser beam irradiation apparatus 400. Thus, only the predetermined portion of the ohmic contact layer pattern 140 exposed between the source electrode pattern 160 and the drain electrode pattern 150 is removed as shown in FIG. 2I. At this time, since selectivity of the laser beam 410 is so great as to selectively remove a singular layer according to power, only the predetermined portion of the ohmic contact layer pattern 140 can be removed without damage on the semiconductor layer pattern 130. In order to prevent the semiconductor layer pattern 130 from being damaged when removing the ohmic contact layer pattern 140, the third laser beam irradiation apparatus 400 applies the third laser beam 410, whose power is gradually decreased as approaching to the semiconductor layer pattern 130, to the ohmic contact layer pattern 140 several times, to thereby remove only the predetermined portion of the ohmic contact layer pattern 140 exposed between the source electrode pattern 160 and the drain electrode pattern 150.

Figure 2J:
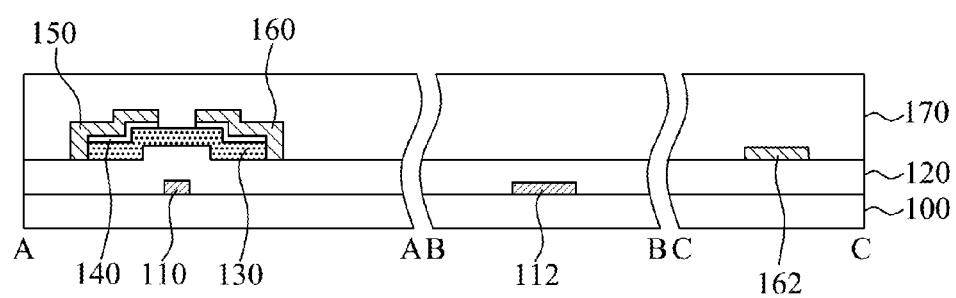

Then, as shown in FIG. 2J, a passivation layer 170 is formed on the entire surface of the substrate 100 including the source electrode pattern 160 and the drain electrode pattern 150. At this time, the passivation layer 170 may be formed of any one of silicon nitride (SiNx), silicon oxide (SiOx), BCB (BenzoCycloButene) and acrylic resin.

Figure 2K:
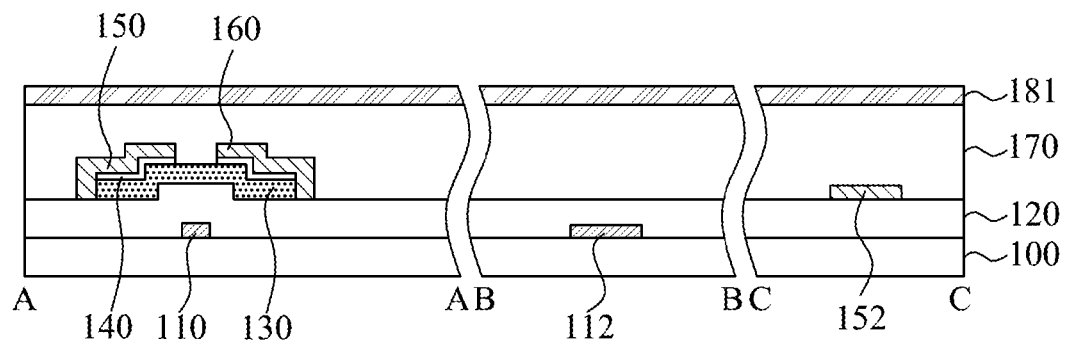

As shown in FIG. 2K, a conductive layer 181 is formed on the passivation layer 170. The conductive layer 181 may be formed of a transparent conductive material, for example, ITO (Indium Tin Oxide), IZO (Indium Zinc Oxide), AZO or ZnO.

Figure 2L:
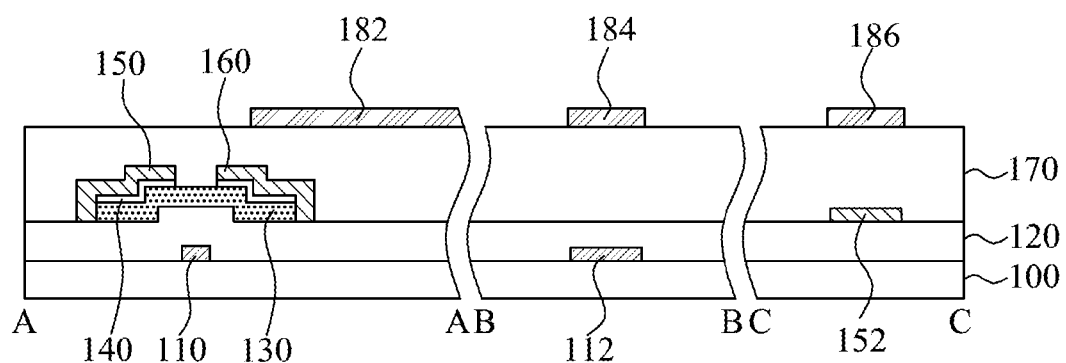

According as the conductive layer 181 is patterned by the laser scribing process explained with reference to FIGS. 3A to 3G, a pixel electrode pattern 182, a gate pad pattern 184, and a data pad pattern 186 are formed as shown in FIG. 1 and FIG. 2L.

Figure 2M:
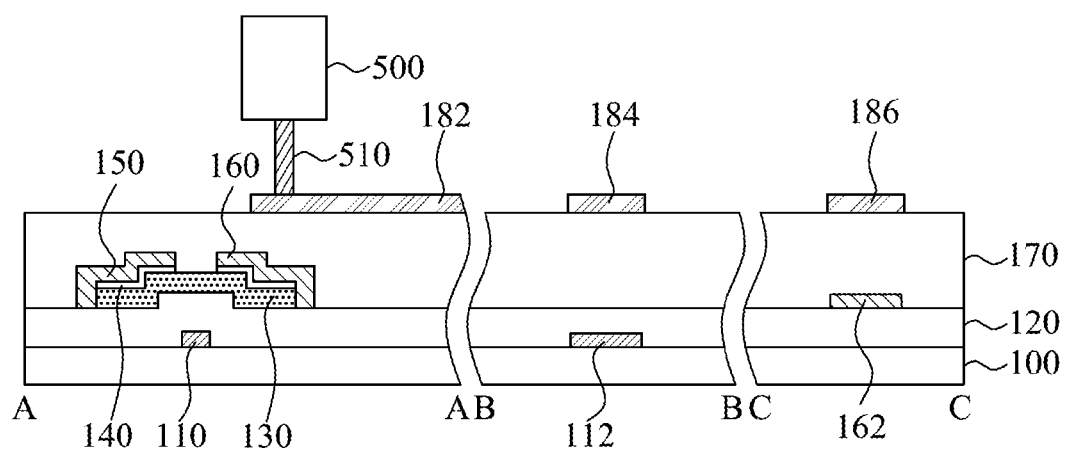
Figure 2N:
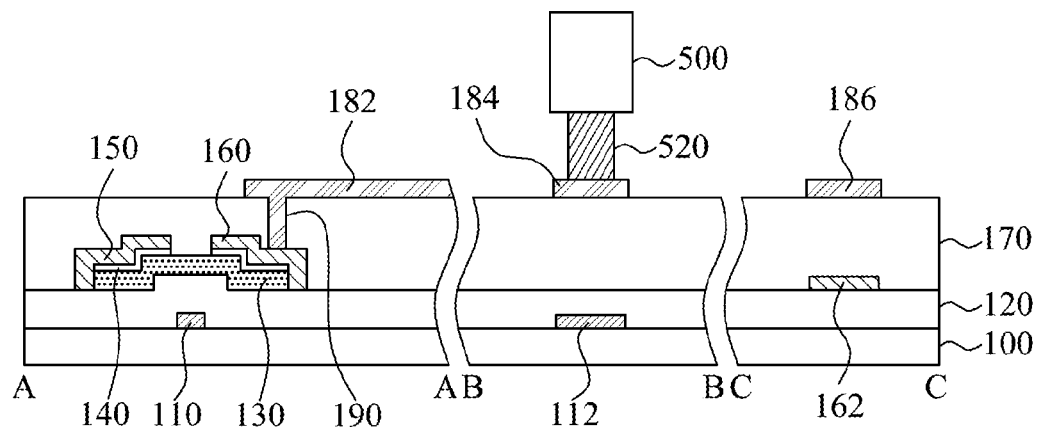

As shown in FIG. 2M, a fourth laser beam irradiation apparatus 500 is positioned above a predetermined portion of the pixel electrode pattern 182, wherein the predetermined portion of the pixel electrode pattern 182 overlaps with the source electrode pattern 160. Then, the fourth laser beam irradiation apparatus 500 directly apply a fourth laser beam 510 with a third width to the predetermined portion of the pixel electrode pattern 182. Accordingly, predetermined portions of the passivation layer 170 and the pixel electrode pattern 182, which are positioned above the source electrode pattern 160, are etched by a light energy of the fourth laser beam 510, whereby the pixel electrode pattern 182 is electrically connected with the source electrode pattern 160 through a first contact hole 190 formed in the passivation layer 170, as shown in FIG. 2N. At this time, when the predetermined portion of the pixel electrode pattern 182 is directly irradiated with the fourth laser beam 510 with the third width, the pixel electrode pattern 182 provided in the predetermined portion of the passivation layer 170 is formed with the vertical sidewalls. However, if the pixel electrode pattern 182 is irradiated with the fourth laser beam 510 with the gradually-decreased third width, the pixel electrode pattern 182 provided in the predetermined portion of the passivation layer 170 is formed with inclined sidewalls.

Figure 2O:
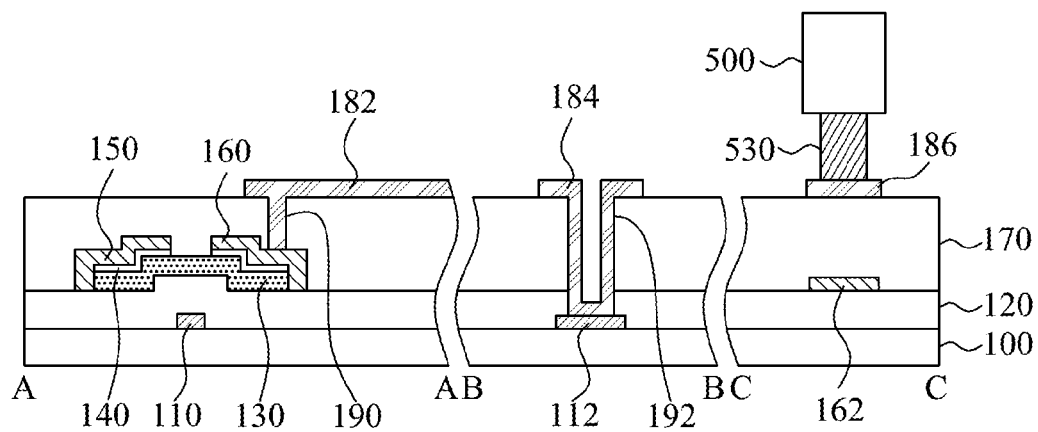
Figure 2P:
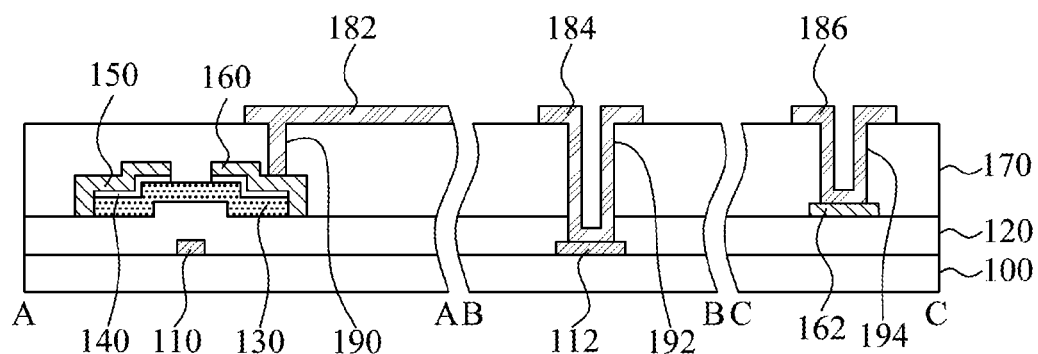

As shown in FIG. 2N, the fourth laser beam irradiation apparatus 500 is positioned above a predetermined portion of the gate pad pattern 184, wherein the predetermined portion of the gate pad pattern 184 overlaps with the gate pad electrode pattern 112. Then, the fourth laser beam irradiation apparatus 500 directly applies a fifth laser beam 520 with a fourth width to the predetermined portion of the gate pad pattern 184. At this time, the fourth width may be the same as or wider than the third width. Accordingly, predetermined portions of the passivation layer 170 and the gate pad pattern 184, which are positioned above the gate pad electrode pattern 112, are etched by a light energy of the fifth laser beam 520, whereby the gate pad pattern 184 is electrically connected with the gate pad electrode pattern 112 through a second contact hole 192 formed in the passivation layer 170, as shown in FIG. 2O. At this time, when the predetermined portion of the gate pad pattern 184 is directly irradiated with the fifth laser beam 520 with the fourth width, the gate pad pattern 184 provided in the predetermined portion of the passivation layer 170 is formed with the vertical sidewalls. However, if the gate pad pattern 184 is irradiated with the fifth laser beam 520 with the gradually-decreased fourth width, the gate pad pattern 184 provided in the predetermined portion of the passivation layer 170 is formed with inclined sidewalls.

To increase a contact area between the gate pad electrode pattern 112 and the gate pad pattern 184, the fifth laser beam 520 is applied several times to the gate pad pattern 184 at fixed intervals, thereby forming a plurality of contact portions between the gate pad electrode pattern 112 and the gate pad pattern 184.

As shown in FIG. 2O, the fourth laser beam irradiation apparatus 500 is positioned above a predetermined portion of the data pad pattern 186, wherein the predetermined portion of the data pad pattern 186 overlaps with the data pad electrode pattern 162. Then, the fourth laser beam irradiation apparatus 500 directly applies a sixth laser beam 530 with a fifth width to the data pad pattern 186. At this time, the fifth width may be a predetermined width between the third width and the fourth width, or may be the same as or wider than the fourth width. Accordingly, predetermined portions of the passivation layer 170 and the data pad pattern 186, which are positioned above the data pad electrode pattern 162, are etched by a light energy of the sixth laser beam 530, whereby the data pad pattern 186 is electrically connected with the data pad electrode pattern 162 through a third contact hole 194 formed in the passivation layer 170, as shown in FIG. 2P. At this time, when the predetermined portion of the data pad pattern 186 is directly irradiated with the sixth laser beam 530 with the fifth width, the data pad pattern 186 provided in the predetermined portion of the passivation layer 170 is formed with the vertical sidewalls. However, if the data pad pattern 186 is irradiated with the sixth laser beam 530 with the gradu-ally-decreased fifth width, the data pad pattern 186 provided in the predetermined portion of the passivation layer 170 is formed with inclined sidewalls.

To increase a contact area between the data pad electrode pattern 162 and the data pad pattern 186, the sixth laser beam 530 is applied several times to the data pad pattern 186 at fixed intervals, thereby forming a plurality of contact portions between the data pad electrode pattern 162 and the data pad pattern 186.

All patterning processes for the TFT array substrate according to the present invention are performed by the laser scribing process, whereby the fabrication process is simplified and the fabrication time is reduced. Also, only the ohmic contact layer pattern 140 positioned between the source electrode pattern 160 and the drain electrode pattern 150 is removed by using the third laser beam 410 so that it is possible to prevent the semiconductor layer pattern 130 from being damaged during the process of removing the ohmic contact layer pattern 140. In addition, the respective electrical connections between the source electrode pattern 160 and the pixel electrode pattern 182, between the gate pad electrode pattern 112 and the gate pad pattern 184, and between the data pad electrode pattern 162 and the data pad pattern 186 are performed by using the fourth, fifth and sixth laser beams 510, 520 and 530, whereby the fabrication process is simplified and the fabrication time is reduced.

As a result, the method of fabricating the TFT array substrate according to the present invention can prevent lowering of yield by preventing the damage on the semiconductor layer pattern 130, can simplify the fabrication process, and can reduce the fabrication time.

The method of fabricating the TFT array substrate according to the present invention sequentially performs the first electrical-connection process for electrically connecting the source electrode pattern 160 with the pixel electrode pattern 182, the second electrical-connection process for electrically connecting the gate pad electrode pattern 112 with the gate pad pattern 184, and the third electrical-connection process for electrically connecting the data pad electrode pattern 162 with the data pad pattern 186. However, it is not limited to this. Thus, these electrical-connection steps may vary within the range which is capable of reducing the fabrication time as shown in FIGS. 4A and 4B and FIG. 5.

Figure 4A:
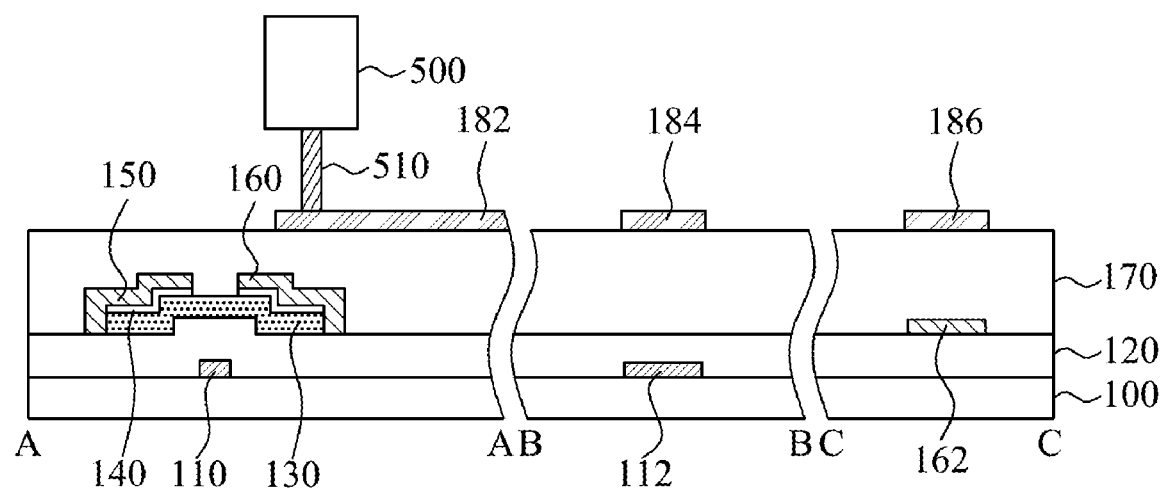
FIGS. 4A and 4B are a series of cross section views for explaining first to third electrical-connection processes according to one embodiment of the present invention.
Figure 4B:
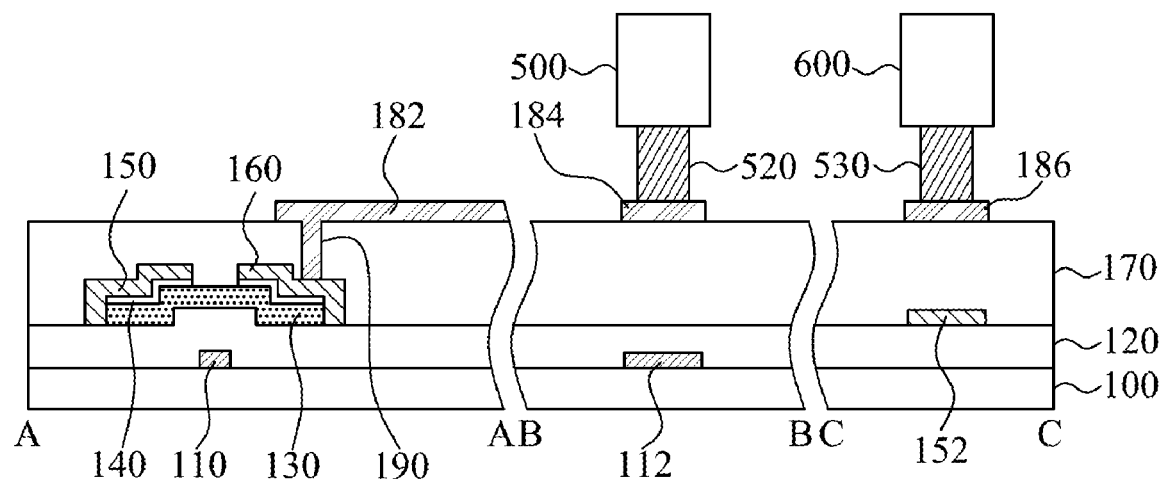

In case of the fabrication method according to one embodiment of the present invention, as shown in FIG. 4A, the first electrical-connection process is firstly performed by irradiating the pixel electrode pattern 182 with the fourth laser beam 510 by using the fourth laser beam irradiation apparatus 500. Thereafter, as shown in FIG. 4B, the gate pad pattern 184 is irradiated with the fifth laser beam 520 by using the fourth laser beam irradiation apparatus 500, and simultaneously the data pad pattern 186 is irradiated with the sixth laser beam 530 by using the fifth laser beam irradiation apparatus 600, that is, the second and third electrical-connection processes are performed at the same time.

Figure 5:
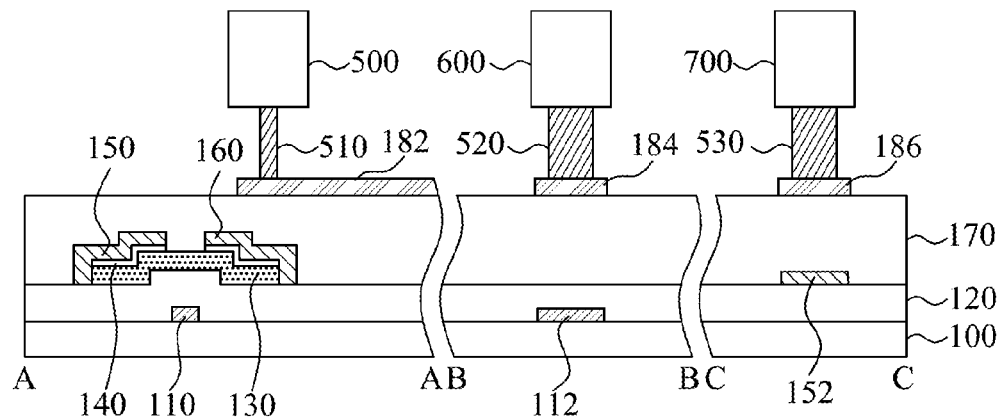
FIG. 5 is a cross section view for explaining first to third electrical-connection processes according to another embodiment of the present invention.

In case of the fabrication method according to another embodiment of the present invention, as shown in FIG. 5, the pixel electrode pattern 182 is irradiated with the fourth laser beam 510 by using the fourth laser beam irradiation apparatus 500; the gate pad pattern 184 is irradiated with the fifth laser beam 520 by using the fifth laser beam irradiation apparatus 600; and the data pad pattern 186 is irradiated with the sixth laser beam 530 by using a sixth laser beam irradiation apparatus 700.

FIGS. 6A to 6E are a series of cross section views illustrating a method of fabricating a TFT array substrate according to another embodiment of the present invention.

First, a substrate including a passivation layer 170 is prepared by sequential steps explained with reference to FIGS. 2A to 2J.

Figure 6A:
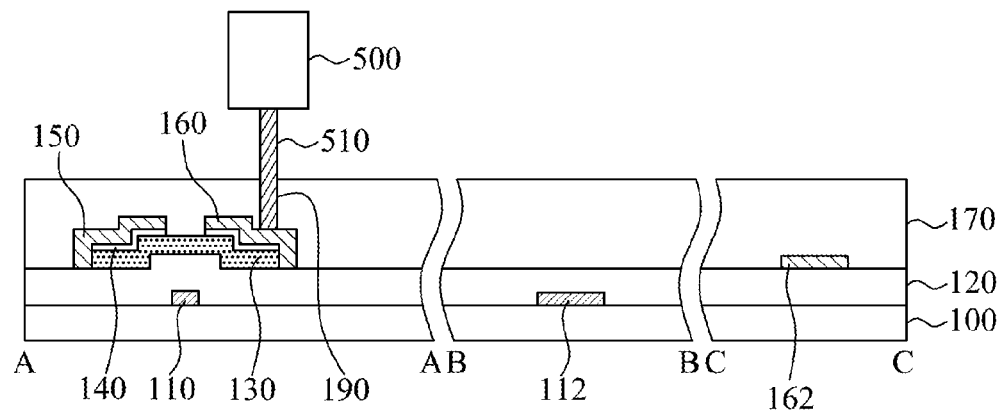
FIGS. 6A to 6E are a series of cross section views illustrating a method of fabricating a TFT array substrate according to the second embodiment of the present invention.

Then, as shown in FIG. 6A, the aforementioned fourth laser beam irradiation apparatus 500 is positioned above a source electrode pattern 160. Then, a predetermined portion of the passivation layer 170, which is positioned above the source electrode pattern 160, is removed by using a fourth laser beam 510 emitted from the fourth laser beam irradiation apparatus 500, to thereby form a first contact hole 190 to expose a predetermined portion of the source electrode pattern 160.

Figure 6B:
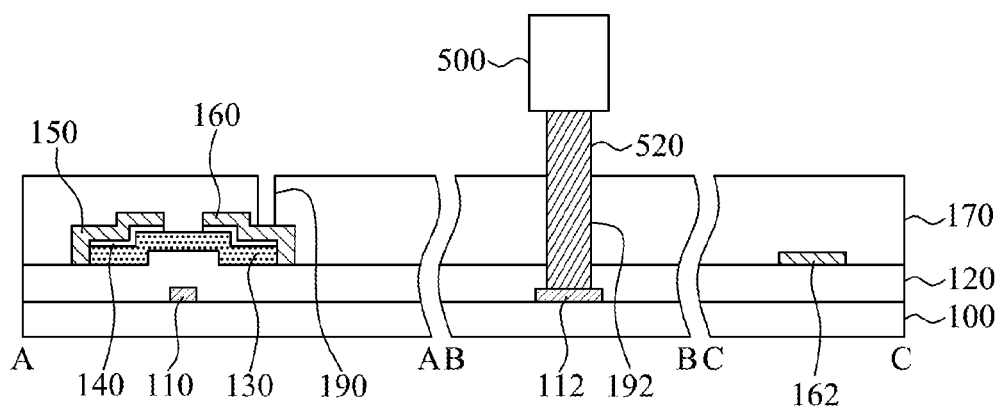

Then, as shown in FIG. 6B, the aforementioned fourth laser beam irradiation apparatus 500 is positioned above a gate pad electrode pattern 112. Then, predetermined portions of the passivation layer 170 and a gate insulating layer 120, which are positioned above the gate pad electrode pattern 112, are removed by using a fifth laser beam 520 emitted from the fourth laser beam irradiation apparatus 500, to thereby form a second contact hole 192 to expose a predetermined portion of the gate pad electrode pattern 112.

Figure 6C:
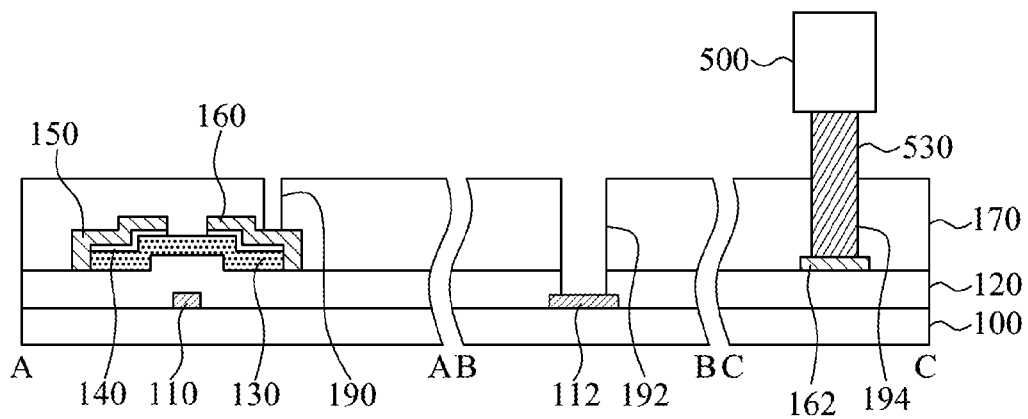

As shown in FIG. 6C, the aforementioned fourth laser beam irradiation apparatus 500 is positioned above a data pad electrode pattern 162. Then, a predetermined portion of the passivation layer 170, which is positioned above the data pad electrode pattern 162, is removed by using a sixth laser beam 530 emitted from the fourth laser beam irradiation apparatus 500, to thereby form a third contact hole 194 to expose a predetermined portion of the data pad electrode pattern 162.

Figure 6D:
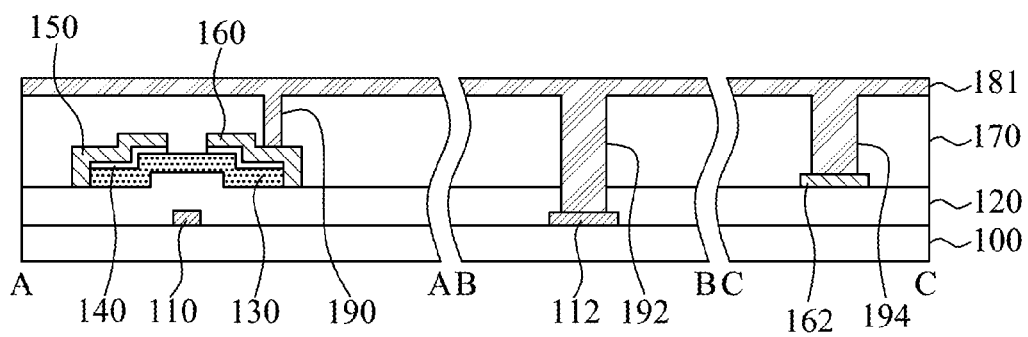

As shown in FIG. 6D, a conductive layer 181 is formed on the passivation layer 170.

Figure 6E:
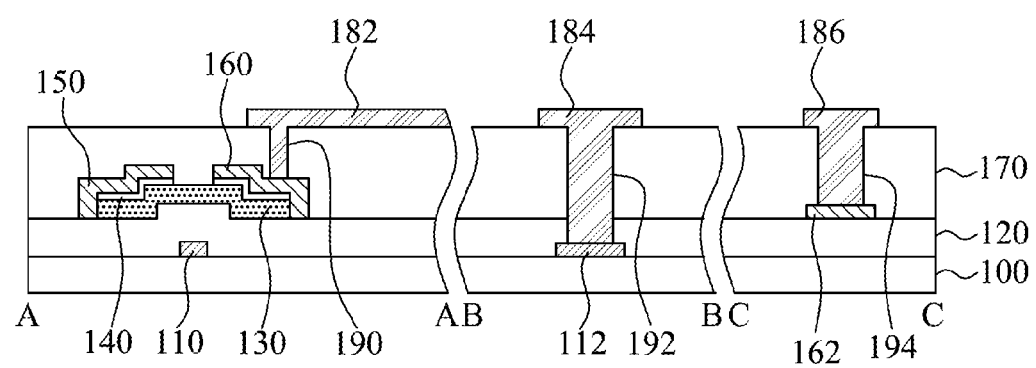

The conductive layer 181 is patterned by the aforementioned laser scribing process explained with reference to FIGS. 3A to 3G, thereby forming a pixel electrode pattern 182 electrically connected with the source electrode pattern 160 through the first contact hole 190, a gate pad pattern 184 electrically connected with the gate pad electrode pattern 112 through the second contact hole 192, and a data pad pattern 186 electrically connected with the data pad electrode pattern 162 through the third contact hole 194, as shown in FIG. 1 and FIG. 6E.

As mentioned above, the first, second and third contact holes 190, 192 and 194 may be formed in sequence, but it is not limited to this sequential method. The method of forming the first, second and third contact holes may vary within the range which is capable of reducing the fabrication time as shown in FIGS. 7A and 7B and FIG. 8.

Figure 7A:
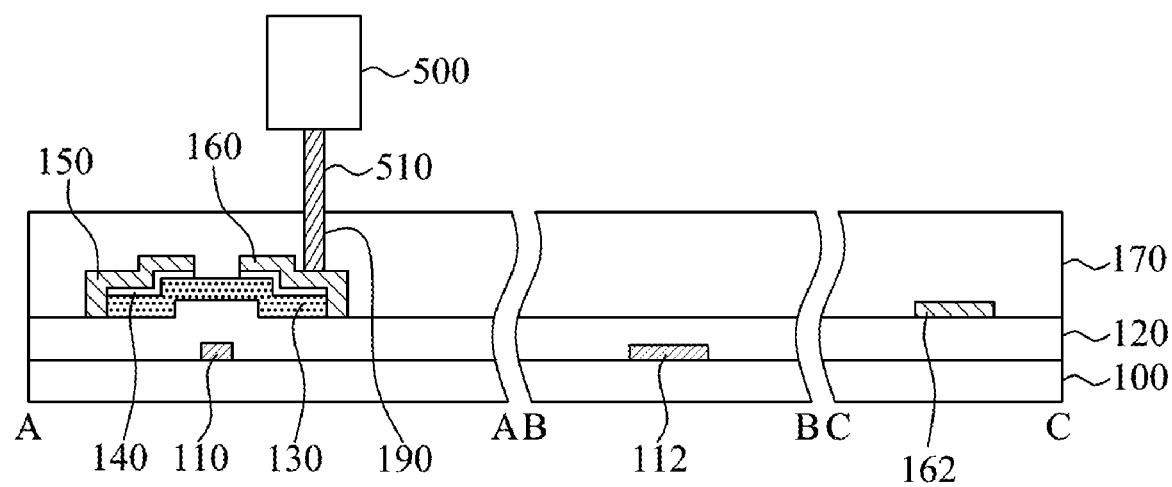
FIGS. 7A and 7B are a series of a process of forming first to third contact holes according to one embodiment of the present invention.
Figure 7B:
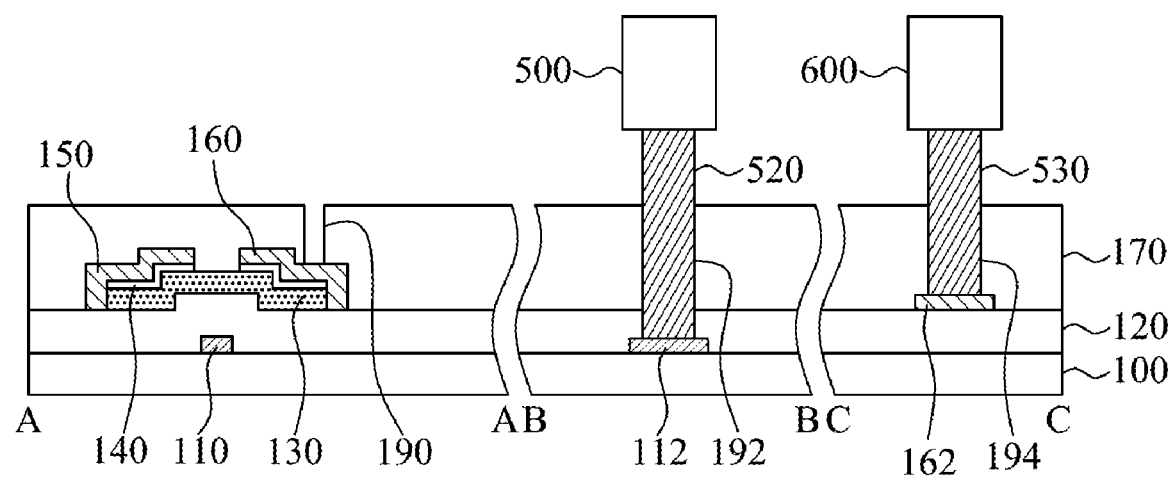

In case of the method of forming the contact holes according to one embodiment of the present invention, the first contact hole 190 is firstly formed by using the fourth laser beam 510 emitted from the fourth laser beam irradiation apparatus 500, as shown in FIG. 7A. Thereafter, as shown in FIG. 7B, the second contact hole 192 is formed by using the fifth laser beam 520 emitted from the fourth laser beam irradiation apparatus 500, and simultaneously the third contact hole 194 is formed by using the sixth laser beam 530 emitted from the fifth laser beam irradiation apparatus 600.

Figures 8, 9:
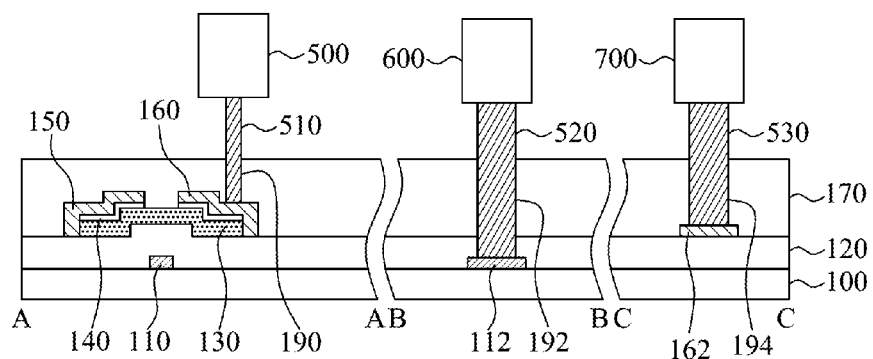
FIG. 8 is a cross section view illustrating a process of forming first to third contact holes according to another embodiment of the present invention.
FIG. 9 is a block diagram illustrating an apparatus of fabricating a TFT array substrate according to the first embodiment of the present invention.

In case of the method of forming the contact holes according to another embodiment of the present invention, the first, second and third contact holes 190, 192 and 194 are simultaneously formed by using the respective fourth, fifth and sixth laser beams 510, 520 and 530 emitted from the fourth, fifth and sixth laser beam irradiation apparatuses 500, 600 and 700, as shown in FIG. 8.

FIG. 9 is a block diagram illustrating an apparatus of fabricating a TFT array substrate according to the first embodiment of the present invention.

Referring to FIG. 9 in connection with FIG. 1 to FIG. 3G, the apparatus of fabricating the TFT array substrate according to the first embodiment of the present invention includes a gate material forming part 800, a gate material pattern forming part 802, a gate insulating layer forming part 804, a semiconductor layer forming part 806, a semiconductor layer pattern forming part 808, a data material forming part 810, a data material pattern forming part 812, an ohmic contact layer removing part 814, a passivation layer forming part 816, a conductive layer forming part 818, a conductive layer pattern forming part 820, and an electrical-connection performing part 822. In addition, the apparatus of fabricating the TFT array substrate according to the first embodiment of the present invention may include an additional cleaning/drying part, positioned between each process, for cleaning and drying the substrate. Herein, steps performed by the aforementioned parts may proceed as an in-line type.

As shown in FIG. 2A, the gate material forming part 800 forms a gate material 101 on an entire surface of the substrate 100 through the use of deposition apparatus.

The gate material pattern forming part 802 forms a gate line (GL), a gate electrode pattern 110 and a gate pad electrode pattern 112 on the substrate 100 shown in FIG. 1 and FIG. 2B through a laser scribing process shown in FIGS. 3A to 3G. For this, the gate material pattern forming part 802 is comprised of a laser scribing apparatus shown in FIG. 10.

Figure 10:
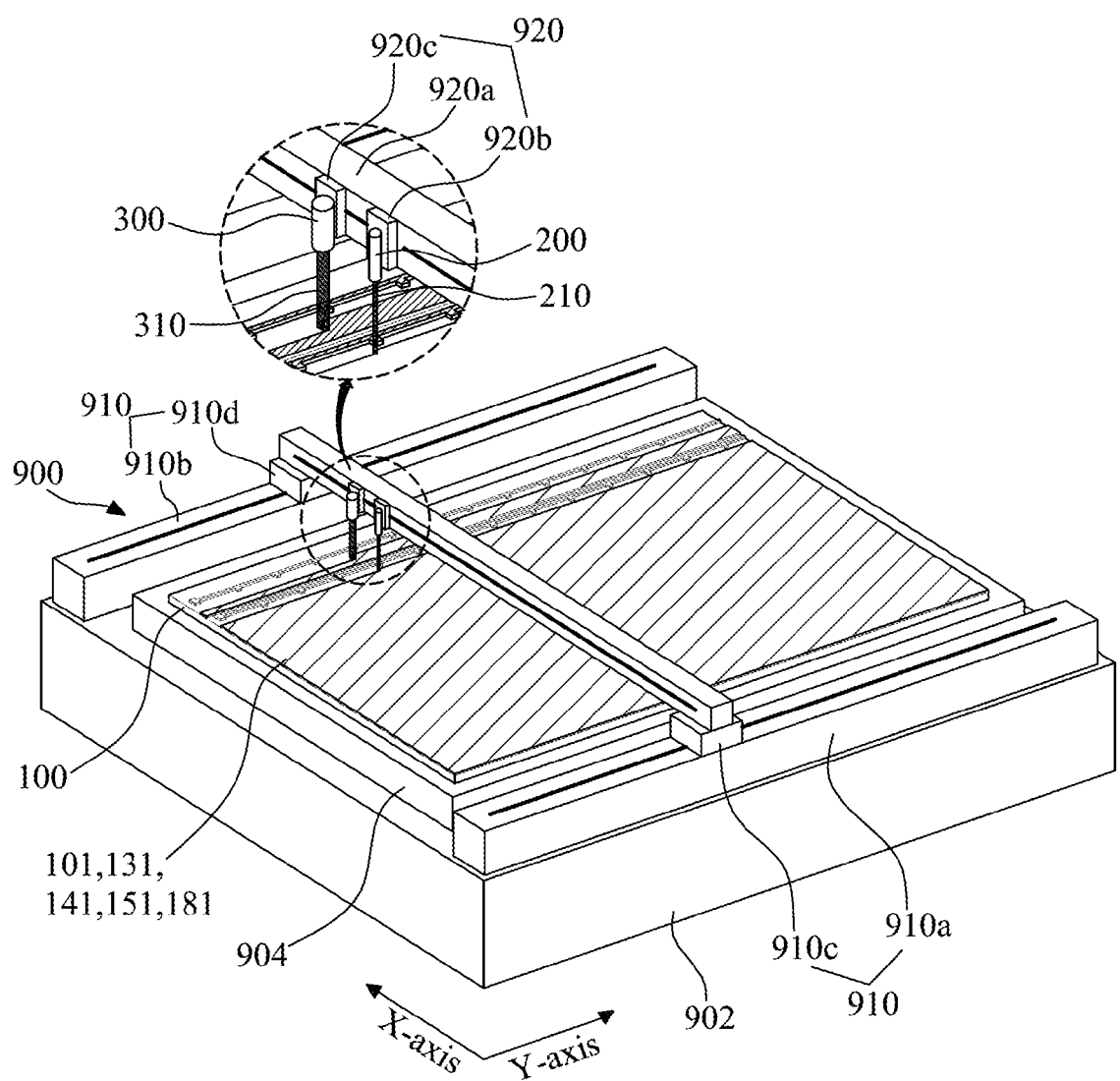
FIG. 10 is a view illustrating a laser scribing apparatus according to the first embodiment of the present invention.

Referring to FIG. 10, the laser scribing apparatus according to the embodiment of the present invention includes a base frame 902, a stage 904, a gantry 900, and first and second laser beam irradiation apparatuses 200 and 300.

The base frame 902 supports the stage 904. Inside the base frame 902, there may be a driving/controlling apparatus (not shown) which drives and controls the stage 904, the gantry 900, and the first and second laser beam irradiation apparatuses 200 and 300, respectively.

The substrate 100 is transferred by an external substrate-transfer (not shown), and the transferred substrate 100 is loaded on the stage 904. At this time, the substrate-transfer loads the substrate 100 with the gate material 101 on the stage 904.

In the meantime, the stage 904 may include an additionally-provided lift pin (not shown) for loading or unloading the substrate 100, and also include a plurality of vacuum pads (not shown) for a vacuum suction of the loaded substrate 100. Also, the stage 904 may be moved at the X-axis and Y-axis directions by the driving/controlling apparatus (not shown).

The gantry 900 is comprised of a first gantry 910 installed on the base frame 902; and a second gantry 920, installed in the first gantry 910, for moving the first and second laser beam irradiation apparatuses 200 and 300 at the X-axis direction.

The first gantry 910 moves the second gantry 920 at the Y-axis direction through the use of LM guide or linear motor. For this, the first gantry 910 may be comprised of a pair of first guiders 910a and 910b and a pair of first sliders 910c and 910d, wherein the pair of first guiders 910a and 910b are respectively installed in parallel at both edges of the base frame 902, and the pair of first sliders 910c and 910d are respectively installed in the first guiders 910a and 910b.

The second gantry 920 moves at the Y-axis direction according to the operation of the first gantry 910, and also moves the first and second laser beam irradiation apparatuses 200 and 300 to the X-axis direction through the use of LM guide or linear motor. For this, the second gantry 920 is comprised of a second guider 920a connected between the pair of first sliders 910c and 910d; a second slider 920b installed in the second guider 920a; and a third slider 920c provided at a predetermined interval from the second slider 920b and installed in the second guider 920a.

The first laser beam irradiation apparatus 200 is installed in the second slider 920b. The first laser beam irradiation apparatus 200 is moved to the Y-axis direction according as the pair of first sliders 910c and 910d are transferred by the operation of the first gantry 910; and the first laser beam irradiation apparatus 200 is also moved to the X-axis direction according as the second slider 920b is transferred by the operation of the second gantry 920. While the first laser beam irradiation apparatus 200 is moved to the X-axis and Y-axis directions by the operation of the gantry 900, the first laser beam irradiation apparatus 200 directly applies a first laser beam 210 with a first width to the gate material 101 corresponding to a first region to be provided with a thin film pattern, thereby forming a gate line (GL), a gate electrode pattern 110, and a gate pad electrode pattern 112, as shown in FIG. 1 and FIG. 2B.

The second laser beam irradiation apparatus 300 is installed in the third slider 920c. The second laser beam irradiation apparatus 300 is moved to the Y-axis direction according as the pair of first sliders 910c and 910d are transferred by the operation of the first gantry 910; and the second laser beam irradiation apparatus 300 is also moved to the X-axis direction according as the third slider 920c is transferred by the operation of the second gantry 920. While the second laser beam irradiation apparatus 300 is moved to the X-axis and Y-axis directions by the operation of the gantry 900, the second laser beam irradiation apparatus 300 directly applies a second laser beam 310 with a second width to the gate material 101 corresponding to a second region not to be provided with the thin film pattern, thereby removing the gate material 101 from the second region on the substrate 100.

The aforementioned laser scribing apparatus according to the first embodiment of the present invention discloses that the first and second laser beam irradiation apparatuses 200 and 300 are moved. However, it is not limited to this structure. For example, only the stage 904 may be moved after fixedly providing the first and second laser beam irradiation apparatuses 200 and 300; or the first and second laser beam irradiation apparatuses 200 and 300 and the stage 904 may be moved simultaneously.

Figure 11:
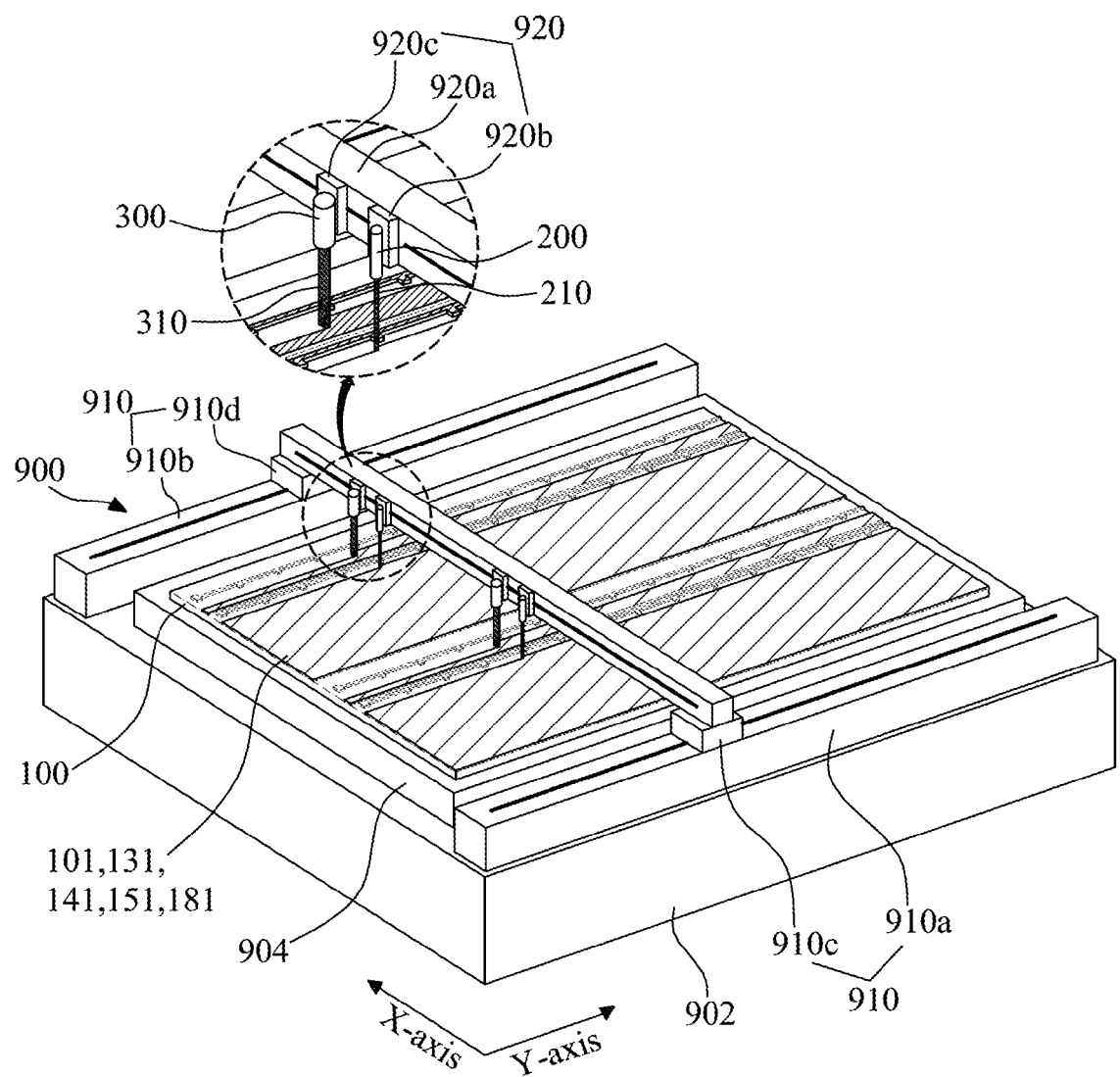
FIG. 11 is a view illustrating a laser scribing apparatus according to the second embodiment of the present invention.

As shown in FIG. 11, the laser scribing apparatus according to the second embodiment of the present invention may include the plurality of pairs of the laser beam irradiation apparatuses, each pair comprising the first and second laser beam irradiation apparatuses 200 and 300, wherein the respective pairs are positioned at fixed intervals on the second gantry 920 of the gantry 900, thereby reducing the fabrication time. The laser scribing apparatus according to the second embodiment of the present invention performs the aforementioned patterning process under such circumstance that the substrate 100 is divided into at least two regions and the first and second laser beam irradiation apparatuses 200 and 300 are installed in each of the at least two regions, to thereby reduce the fabrication time.

Figure 12:
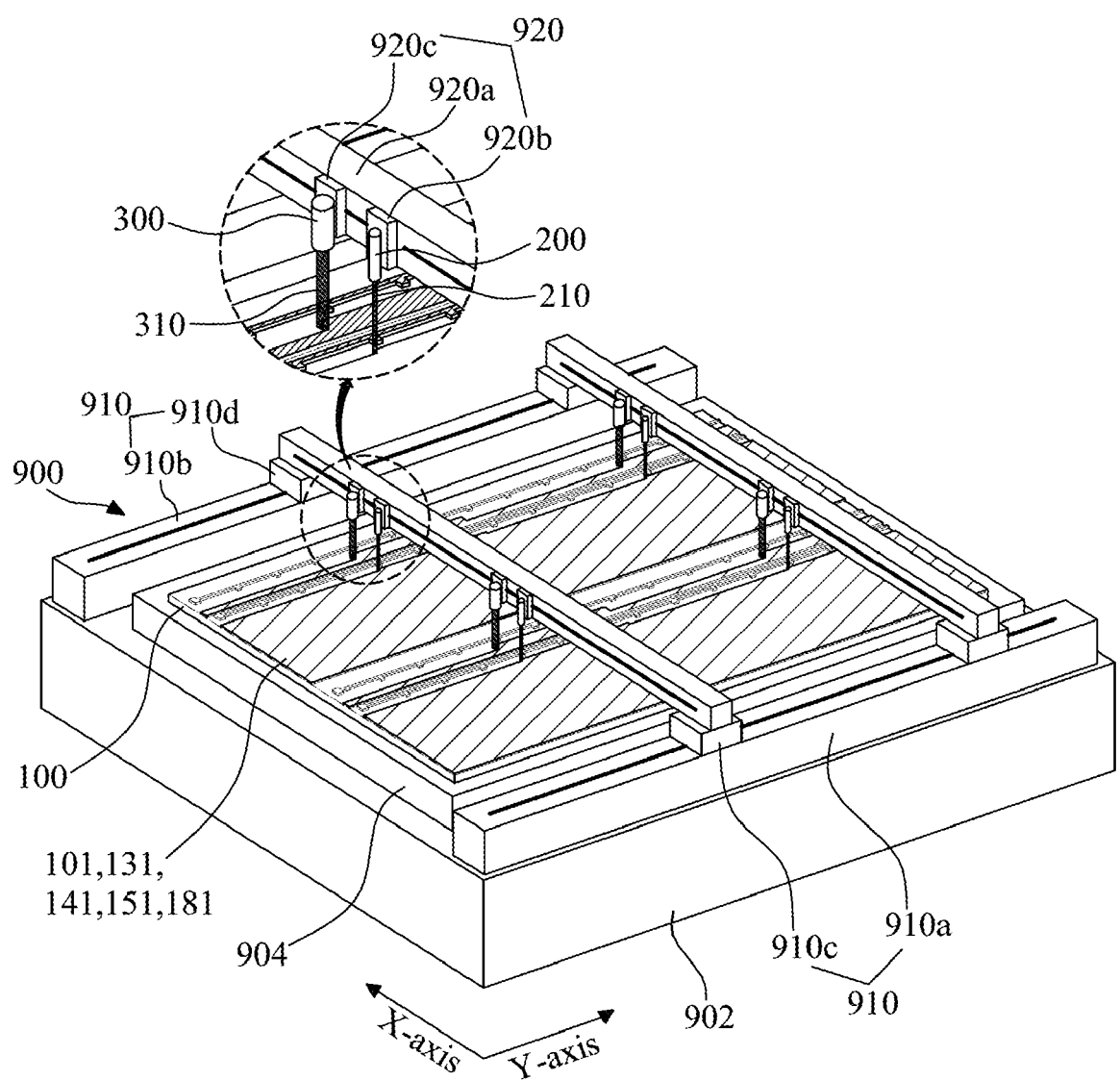
FIG. 12 is a view illustrating a laser scribing apparatus according to the third embodiment of the present invention.

As shown in FIG. 12, in case of the laser scribing apparatus according to the third embodiment of the present invention, the plurality of second gantries 920 are installed at fixed intervals on the first gantry 910; and the plurality of pairs of the laser beam irradiation apparatuses, each pair comprising the first and second laser beam irradiation apparatuses 200 and 300, are positioned at fixed intervals on each of the second gantries 920, to thereby reduce the fabrication time. The laser scribing apparatus according to the third embodiment of the present invention performs the aforementioned patterning process under such circumstance that the substrate 100 is divided into at least four regions and the first and second laser beam irradiation apparatuses 200 and 300 are installed in each of the at least four regions, to thereby reduce the fabrication time.

Referring one again to FIG. 9, the gate insulating layer forming part 804 forms the gate insulating layer 120 on the entire surface of the substrate 100 including the gate line (GL), the gate electrode pattern 110, and the gate pad electrode pattern 112, as shown in FIG. 1 and FIG. 2C.

The semiconductor layer forming part 806 sequentially forms a semiconductor layer 131 and an ohmic contact layer 141 on an entire surface of the gate insulating layer 120 through the use of deposition apparatus, as shown in FIG. 2D.

The semiconductor layer forming part 806 may pattern the semiconductor layer 131 and the ohmic contact layer 141 sequentially or simultaneously through the laser scribing process explained with reference to FIGS. 3A to 3G, thereby forming the semiconductor layer pattern 130 and the ohmic contact layer pattern 140 in the region above the gate electrode pattern 110, as shown in FIG. 2E. This patterning process may be performed by the semiconductor layer pattern forming part 808 through the laser scribing apparatus explained with reference to any one of FIG. 10, FIG. 11 and FIG. 12.

As shown in FIG. 2F, the data material forming part 810 forms the data material 151 on the entire surface of the substrate 100 including the semiconductor layer pattern 130 and the ohmic contact layer pattern 140 through the use of deposition apparatus.

The data material pattern forming part 812 patterns the data material 151 by the same method as the aforementioned laser scribing process explained with reference to FIGS. 3A to 3G, to thereby form the data pattern including the data line (DL), the source and drain electrode patterns 160 and 150 formed at a predetermined interval therebetween and provided on the ohmic contact layer pattern 140, and the data pad electrode pattern 162, as shown in FIG. 1 and FIG. 2G. The data material pattern forming part 812 may perform the patterning process through the use of laser scribing apparatus explained with reference to any one of FIG. 10, FIG. 11 and FIG. 12.

As shown in FIG. 2H, the ohmic contact layer removing part 814 applies the third laser beam 410 at least once to the ohmic contact layer pattern 140 exposed in the region (channel region (CH) of thin film transistor) between the source and drain electrode patterns 160 and 150 through the use of third laser beam irradiation apparatus 400, thereby removing only the ohmic contact layer pattern 140 exposed between the source and drain electrode patterns 160 and 150, as shown in FIG. 2I. At this time, since selectivity of the third laser beam 410 is so great as to selectively remove a singular layer according to power, only the ohmic contact layer pattern 140 can be removed without damage on the semiconductor layer pattern 130. In order to prevent the semiconductor layer pattern 130 from being damaged when removing the ohmic contact layer pattern 140, the third laser beam irradiation apparatus 400 applies the third laser beam 410, whose power is gradually decreased as approaching to the semiconductor layer pattern 130, to the ohmic contact layer pattern 140 several times, to thereby remove only the ohmic contact layer pattern 140 exposed between the source electrode pattern 160 and the drain electrode pattern 150.

Figure 13:
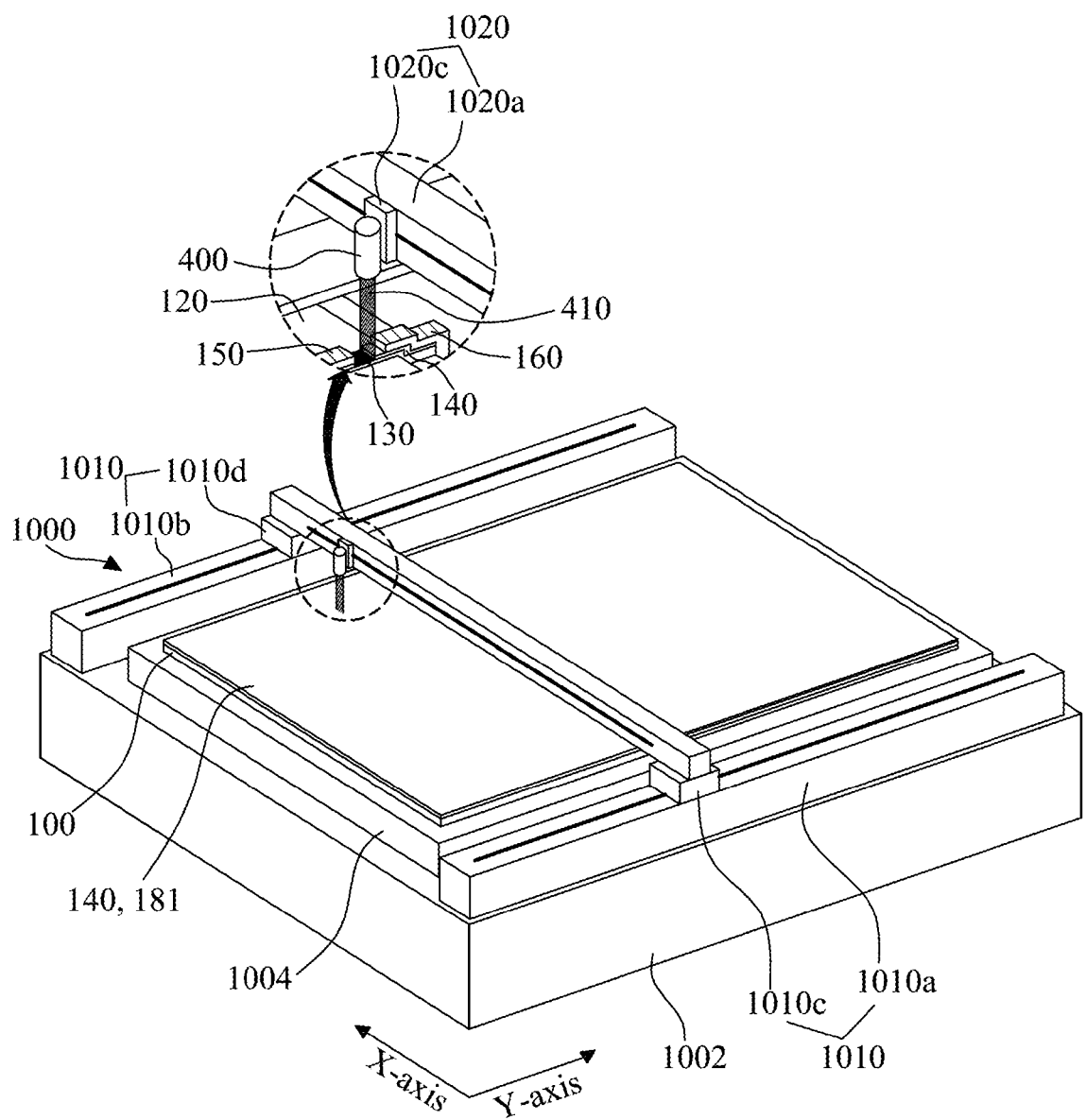
FIG. 13 is a view illustrating a laser scribing apparatus according to the fourth embodiment of the present invention.

For this, the ohmic contact layer removing part 814 is comprised of the laser scribing apparatus shown in FIG. 13 according to the fourth embodiment of the present invention.

Referring to FIG. 13, the laser scribing apparatus according to the fourth embodiment of the present invention includes a base frame 1002, a stage 1004, a gantry 1000 and a third laser beam irradiation apparatus 400. Except for providing the third laser beam irradiation apparatus 400, the laser scribing apparatus according to the fourth embodiment of the present invention is identical in structure to the laser scribing apparatus according to the first embodiment of the present invention. Even though reference numbers used to explain the laser scribing apparatus according to the fourth embodiment of the present invention are different from those of the laser scribing apparatus according to the first embodiment of the present invention, their structures are substantially identical, whereby the aforementioned explanation for the same structures can substitute for the detailed explanation for the structures of the laser scribing apparatus according to the fourth embodiment of the present invention.

The third laser beam irradiation apparatus 400 is installed in a second slider 1020b. The third laser beam irradiation apparatus 400 is moved to the Y-axis direction according as a pair of first sliders 1010c and 1010d are transferred by an operation of a first gantry 1010; and the third laser beam irradiation apparatus 400 is also moved to the X-axis direction according as the second slider 1020b is transferred by an operation of a second gantry 1020. While the third laser beam irradiation apparatus 400 is moved to the X-axis and Y-axis directions by the operation of the gantry 1000, the third laser beam irradiation apparatus 400 directly applies a third laser beam 410 to a substrate 100, thereby removing only an ohmic contact layer pattern 140 exposed between source and drain electrode patterns 160 and 150, as shown in FIG. 1E.

In the same manner as the laser scribing apparatuses according to the second and third embodiments of the present invention, the third laser beam irradiation apparatus 400 of the laser scribing apparatus according to the fourth embodiment of the present invention may be comprised of the plurality of laser beam irradiation apparatuses.

Referring one again to FIG. 9, the passivation layer forming part 816 forms a passivation layer 170 on an entire surface of the substrate 100 including the source and drain electrode patterns 160 and 150, as shown in FIG. 2J.

The conductive layer forming part 818 forms a conductive material 181 on the passivation layer 170, as shown in FIG. 2K, wherein the conductive material 181 may be a transparent conductive material, for example, ITO, IZO, AZO or ZnO.

The conductive layer pattern forming part 820 patterns the conductive material 181 by the same method as the laser scribing process explained with reference to FIGS. 3A to 3G, thereby forming a pixel electrode pattern 182, a gate pad pattern 184 and a data pad pattern 186, as shown in FIG. 1 and FIG. 2L. The conductive layer pattern forming part 820 can perform the aforementioned patterning process by using the laser scribing apparatus shown in any one of FIG. 10, FIG. 11 and FIG. 12.

As shown in FIG. 2M, the electrical-connection performing part 822 makes the fourth laser beam irradiation apparatus 500 positioned above the predetermined portion of the pixel electrode pattern 182, wherein the predetermined portion of the pixel electrode pattern 182 overlaps with the source electrode pattern 160. Then, the predetermined portion of the pixel electrode pattern 182 is directly irradiated with the fourth laser beam 510 having the third width emitted from the fourth laser beam irradiation apparatus 500. Accordingly, predetermined portions of the passivation layer 170 and the pixel electrode pattern 182, which are positioned above the source electrode pattern 160, are etched by a light energy of the fourth laser beam 510, whereby the pixel electrode pattern 182 is electrically connected with the source electrode pattern 160 through a first contact hole 190 formed in the passivation layer 170, as shown in FIG. 2N. At this time, when the predetermined portion of the pixel electrode pattern 182 is directly irradiated with the fourth laser beam 510 having the third width, the pixel electrode pattern 182 provided in the predetermined portion of the passivation layer 170 is formed with the vertical sidewalls. However, if the pixel electrode pattern 182 is irradiated with the fourth laser beam 510 having the gradually-decreased third width, the pixel electrode pattern 182 provided in the predetermined portion of the passivation layer 170 is formed with inclined sidewalls.

As shown in FIG. 2N, the electrical-connection performing part 822 makes the fourth laser beam irradiation apparatus 500 positioned above the predetermined portion of the gate pad pattern 184, wherein the predetermined portion of the gate pad pattern 184 overlaps with the gate pad electrode pattern 112. Then, the predetermined portion of the gate pad pattern 184 is directly irradiated with the fifth laser beam 520 having the fourth width emitted from the fourth laser beam irradiation apparatus 500. At this time, the fourth width may be the same as or wider than the third width. Accordingly, predetermined portions of the passivation layer 170 and the gate pad pattern 184, which are positioned above the gate pad electrode pattern 112, are etched by a light energy of the fifth laser beam 520, whereby the gate pad pattern 184 is electrically connected with the gate pad electrode pattern 112, as shown in FIG. 2O. At this time, when the predetermined portion of the gate pad pattern 184 is directly irradiated with the fifth laser beam 520 having the fourth width, the gate pad pattern 184 provided in the predetermined portion of the passivation layer 170 is formed with the vertical sidewalls. However, if the gate pad pattern 184 is irradiated with the fifth laser beam 520 having the gradually-decreased fourth width, the gate pad pattern 184 provided in the predetermined portion of the passivation layer 170 is formed with inclined sidewalls.

To increase a contact area between the gate pad electrode pattern 112 and the gate pad pattern 184, the electrical-connection performing part 822 makes the gate pad pattern 184 irradiated at fixed intervals with the fifth laser beam 520 several times, thereby forming a plurality of contact portions between the gate pad electrode pattern 112 and the gate pad pattern 184.

As shown in FIG. 2O, the electrical-connection performing part 822 makes the fourth laser beam irradiation apparatus 500 positioned above the predetermined portion of the data pad pattern 186, wherein the predetermined portion of the data pad pattern 186 overlaps with the data pad electrode pattern 162. Then, the predetermined portion of the data pad pattern 186 is directly irradiated with the sixth laser beam 530 having the fifth width emitted from the fourth laser beam irradiation apparatus 500. At this time, the fifth width may have a predetermined width between the third and fourth widths, or may be the same as or wider than the fourth width. Accordingly, predetermined portions of the passivation layer 170 and the data pad pattern 186, which are positioned above the data pad electrode pattern 162, are etched by a light energy of the sixth laser beam 530, whereby the data pad pattern 186 is electrically connected with the data pad electrode pattern 162, as shown in FIG. 2P. At this time, when the predetermined portion of the data pad pattern 186 is directly irradiated with the sixth laser beam 530 having the fifth width, the data pad pattern 186 provided in the predetermined portion of the passivation layer 170 is formed with the vertical sidewalls. However, if the data pad pattern 186 is irradiated with the sixth laser beam 530 having the gradually-decreased fifth width, the data pad pattern 186 provided in the predetermined portion of the passivation layer 170 is formed with inclined sidewalls.

To increase a contact area between the data pad electrode pattern 162 and the data pad pattern 186, the electrical-connection performing part 822 makes the data pad pattern 186 irradiated at fixed intervals with the sixth laser beam 530 several times, thereby forming a plurality of contact portions between the data pad electrode pattern 162 and the data pad pattern 186.

The electrical-connection performing part 822 can sequentially perform the aforementioned processes shown in FIGS. 2M to 2O by using the laser scribing apparatus shown in FIG. 13 according to the fourth embodiment of the present invention.

Figure 14:
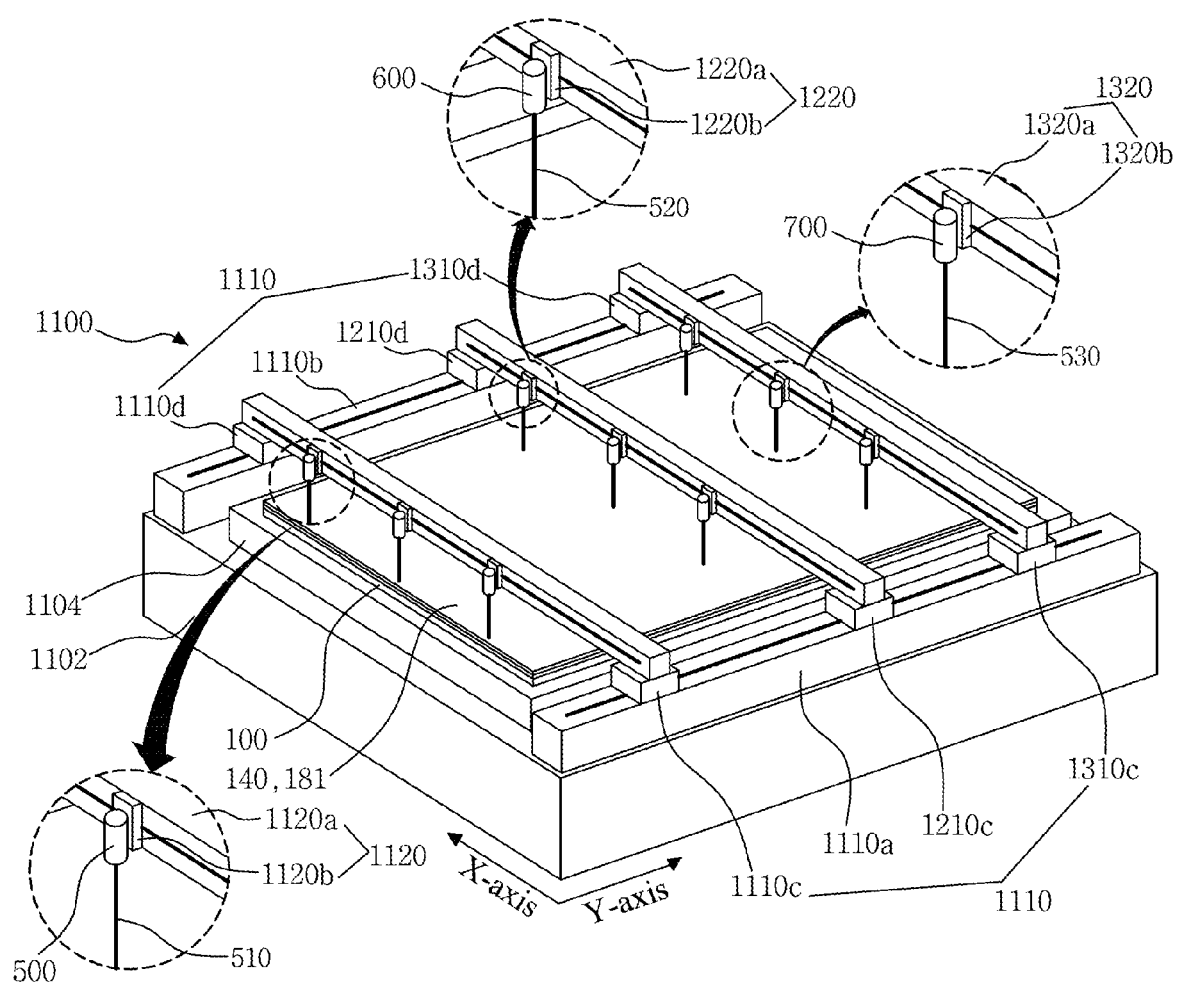
FIG. 14 is a view illustrating a laser scribing apparatus according to the fifth embodiment of the present invention.

As shown in FIGS. 4A to FIG. 5, the electrical-connection performing part 822 may include the laser scribing apparatus of FIG. 14 according to the fifth embodiment of the present invention so as to simultaneously perform at least two of the first to third electrical-connection processes.

Referring to FIG. 14, the laser scribing apparatus according to the fifth embodiment of the present invention includes a base frame 1102, a stage 1104, a gantry 1100, and a plurality of fourth to sixth laser beam irradiation apparatuses 500, 600, and 700.

The base frame 1102 and the stage 1104 in the laser scribing apparatus according to the fifth embodiment of the present invention are identical to those in the laser scribing apparatus according to the fourth embodiment of the present invention, whereby the aforementioned explanation can substitute for the detailed explanation for the base frame 1102 and the stage 1104 in the laser scribing apparatus according to the fifth embodiment of the present invention.

Except that second, third and fourth gantries 1120, 1220 and 1320 are installed in a first gantry 1110, the gantry 1100 in the laser scribing apparatus according to the fifth embodiment of the present invention is identical to that according to the fourth embodiment of the present invention, whereby the aforementioned explanation can substitute for the detailed explanation for the gantry 1100.

A plurality of fourth laser beam irradiation apparatuses 500 are respectively installed in a plurality of fourth sliders 1120b. The plurality of fourth laser beam irradiation apparatuses 500 are moved to the Y-axis direction according as a pair of first sliders 1110c and 1110d are transferred by an operation of the first gantry 1110; and the plurality of fourth laser beam irradiation apparatuses 500 are also moved to the X-axis direction according as a fourth slider 1120b is transferred by an operation of the second gantry 1120. While the plurality of fourth laser beam irradiation apparatuses 500, which are provided at fixed intervals, are respectively moved to the X-axis and Y-axis directions by the operation of the gantry 1100, the plurality of fourth laser beam irradiation apparatuses 500 apply the fourth laser beam 510 with the third width to corresponding divided-regions of the substrate 100, to thereby perform the aforementioned first electrical-connection process. At this time, the substrate 100 may be divided into at least nine regions according to the number of fourth to sixth laser beam irradiation apparatuses 500, 600 and 700. Accordingly, the first electrical-connection process can be performed through the use of fourth laser beam 510 applied to the corresponding divided-regions of the substrate 100 by the plurality of fourth laser beam irradiation apparatuses 500.

A plurality of fifth laser beam irradiation apparatuses 600 are respectively installed in a plurality of fifth sliders 1220b. The plurality of fifth laser beam irradiation apparatuses 600 are moved to the Y-axis direction according as a pair of second sliders 1210c and 1210d are transferred by an operation of the first gantry 1110; and the plurality of fifth laser beam irradiation apparatuses 600 are also moved to the X-axis direction according as a fifth slider 1220b is transferred by an operation of the third gantry 1220. Thus, the plurality of fifth laser beam irradiation apparatuses 600 apply the fifth laser beam 520 with the fourth width to corresponding divided-regions of the substrate 100, to thereby perform the aforementioned second electrical-connection process.

A plurality of sixth laser beam irradiation apparatuses 700 are respectively installed in a plurality of sixth sliders 1320b. The plurality of sixth laser beam irradiation apparatuses 700 are moved to the Y-axis direction according as a pair of third sliders 1310c and 1310d are transferred by an operation of the first gantry 1110; and the plurality of sixth laser beam irradiation apparatuses 700 are also moved to the X-axis direction according as a sixth slider 1320b is transferred by an operation of the fourth gantry 1320. Thus, the plurality of sixth laser beam irradiation apparatuses 700 apply the sixth laser beam 530 with the fifth width to corresponding divided-regions of the substrate 100, to thereby perform the aforementioned third electrical-connection process.

In the meantime, since the second, third and fourth gantries 1120, 1220 and 1320 are installed in the first gantry 1110, a mutual-interference may occur. Accordingly, the first to third electrical-connection processes can be simultaneously performed in the corresponding divided-region of the substrate 100 without the mutual-interference when transferring the second, third and fourth gantries 1120, 1220 and 1320. In case of the corresponding divided-region of the substrate 100 with the mutual-interference when transferring the second, third and fourth gantries 1120, 1220 and 1320, at least two of the first to third electrical-connection processes may be performed simultaneously, or the first to third electrical-connection processes may be performed in sequence.

FIG. 15 is a block diagram illustrating an apparatus of fabricating a TFT array substrate according to the second embodiment of the present invention.

Referring to FIG. 15, the apparatus according to the second embodiment of the present invention includes a gate material forming part 800, a gate material pattern forming part 802, a gate insulating layer forming part 804, a semiconductor layer forming part 806, a semiconductor layer pattern forming part 808, a data material forming part 810, a data material pattern forming part 812, an ohmic contact layer removing part 814, a passivation layer forming part 816, a contact hole forming part 830, a conductive layer forming part 832, and a conductive layer pattern forming part 834. In addition, the apparatus of fabricating the TFT array substrate according to the second embodiment of the present invention may include an additional cleaning/drying part, positioned between each process, for cleaning and drying the substrate. Herein, steps performed by the aforementioned parts may proceed as an in-line type.

Except the contact hole forming part 830, the conductive layer forming part 832, and a conductive layer pattern forming part 834, the apparatus according to the second embodiment of the present invention is identical in structure to the apparatus according to the first embodiment of the present invention, whereby the detailed explanation for the same parts will be omitted.

The contact hole forming part 830 forms first to third contact holes 190, 192 and 194 on a passivation layer 170 through the laser scribing process explained with reference to FIGS. 6A to 6C, FIGS. 7A and 7B, or FIG. 8. For this, the contact hole forming part 830 may be comprised of the laser scribing apparatus explained with reference to FIG. 13 or FIG. 14.

The conductive layer forming part 832 forms a conductive material 181 on the passivation layer 170 including the first to third contact holes 190, 192 and 194 by using the deposition apparatus shown in FIG. 6D.

The conductive layer pattern forming part 834 patterns the conductive material 181 by the same method as the laser scribing process explained with reference to FIGS. 3A to 3G, thereby forming a pixel electrode pattern 182 electrically connected with a source electrode pattern 160 through the first contact hole 190, a gate pad pattern 184 electrically connected with a gate pad electrode pattern 112 through the second contact hole 192, and a data pad pattern 186 electrically connected with a data pad electrode pattern 162 through the third contact hole 194, as shown in FIG. 6E. For this, the conductive layer pattern forming part 834 may be comprised of the laser scribing apparatus shown in any one of FIG. 10, FIG. 11 and FIG. 12.

The aforementioned apparatus of fabricating the TFT array substrate according to the present invention may use the laser scribing process for at least one patterning process among the many processes for fabricating the TFT array substrate, thereby simplifying the fabrication process and reducing the fabrication time. In case of the apparatus of fabricating the TFT array substrate according to the present invention, the ohmic contact layer pattern 140 positioned between the source electrode pattern 160 and the drain electrode pattern 150 can be removed by using the third laser beam 410 so that it is possible to prevent the semiconductor layer pattern 130 from being damaged during the process of removing the ohmic contact layer pattern 140. In addition, through the use of fourth to sixth laser beams 510, 520 and 530, the source electrode pattern 160 is electrically connected with the pixel electrode pattern 182, the gate pad electrode pattern 112 is electrically connected with the gate pad pattern 184, and the data pad electrode pattern 162 is electrically connected with the data pad pattern 186, whereby the fabrication process is simplified and the fabrication time is reduced.

Eventually, the apparatus of fabricating the TFT array substrate according to the present invention can prevent the yield from being lowered, simplify the fabrication process, and reduce the fabrication time.

Accordingly, the method and apparatus of fabricating the TFT array substrate according to the present invention has the following advantages.

At least any one of the patterning processes for fabricating the TFT array substrate according to the present invention is performed by the laser scribing process, thereby enabling the simplified fabrication process and the decreased fabrication time.

Also, only the ohmic contact layer pattern 140 exposed between the source electrode pattern 160 and the drain electrode pattern 150 can be removed by the laser scribing process so that it is possible to prevent the semiconductor layer pattern 130 from being damaged during the process of removing the ohmic contact layer pattern 140.

According as it is possible to prevent the damage on the semiconductor layer pattern 130, the production yield of thin film transistor can be improved.

In addition, through the use of at least one of the laser beams, the source electrode pattern 160 is electrically connected with the pixel electrode pattern 182, the gate pad electrode pattern 112 is electrically connected with the gate pad pattern 184, and the data pad electrode pattern 162 is electrically connected with the data pad electrode pattern 186, whereby the fabrication process is simplified and the fabrication time is reduced.

Furthermore, at least one of the laser beams is used for patterning the passivation layer 170 so as to form the first contact hole 190 to electrically connect the pixel electrode pattern 182 with the source electrode pattern 160, the second contact hole 192 to electrically connect the gate pad pattern 194 with the gate pad electrode pattern 112, and the third contact hole 194 to electrically connect the data pad pattern 186 with the data pad electrode pattern 162, whereby the fabrication process is simplified and the fabrication time is reduced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of fabricating a TFT array substrate comprising:
   forming a gate material on an entire surface of a substrate;
   patterning the gate material to form a gate pattern including a gate line, a gate electrode pattern and a gate pad electrode pattern;
   forming a gate insulating layer on the entire surface of the substrate including the gate pattern;
   forming a semiconductor material including a semiconductor layer and an ohmic contact layer on the gate insulating layer;
   patterning the semiconductor layer and the ohmic contact layer to form a semiconductor pattern including a semiconductor layer pattern and an ohmic contact layer pattern above the gate electrode pattern;
   forming a data material on the entire surface of the substrate including the semiconductor pattern;
   patterning the data material to form source and drain electrode patterns at a predetermined interval from each other, above the data line, the data pad electrode and the ohmic contact layer pattern;
   removing the ohmic contact layer exposed between the source and drain electrode patterns; and
   forming a passivation layer on the entire surface of the substrate from which the ohmic contact layer exposed between the source and drain electrode patterns is removed,
   wherein at least one of the steps of removing the ohmic contact layer pattern, patterning the gate material, patterning the semiconductor layer and the ohmic contact layer, and patterning the data material comprises a first laser scribing process using a laser beam.

2. The method of claim 1, further comprising:
   forming a conductive material on the passivation layer;
   patterning the conductive material to form a pixel electrode pattern, a gate pad pattern and a data pad pattern; and
   performing a first electrical-connection step to electrically connect the pixel electrode pattern with the source electrode pattern, a second electrical-connection step to electrically connect the gate pad pattern with the gate pad electrode pattern, and a third electrical-connection step to electrically connect the data pad pattern with the data pad electrode pattern,
   wherein at least one of patterning the conductive material and the first, second and third electrical-connection steps comprises a second laser scribing process using a laser beam.

3. The method of claim 1, further comprising:
forming first, second and third contact holes in the passivation layer, wherein the first contact hole is provided to expose the source electrode pattern, the second contact hole is provided to expose the gate pad electrode pattern, and the third contact hole is provided to expose the data pad electrode pattern;
forming a conductive material on the passivation layer including the first to third contact holes; and
patterning the conductive material to form a pixel electrode pattern, a gate pad pattern and a data pad pattern, wherein the pixel electrode pattern is electrically connected with the source electrode pattern through the first contact hole, the gate pad pattern is electrically connected with the gate pad electrode pattern through the second contact hole, and the data pad pattern is electrically connected with the data pad electrode pattern through the third contact hole,
wherein at least one of forming the contact hole and patterning the conductive material comprises a second laser scribing process using a laser beam.

4. The method of claim 2, wherein at least one of patterning the gate material, patterning the semiconductor layer and the ohmic contact layer, patterning the data material, and patterning the conductive material patterns a material in a first region on the substrate with a first laser beam having a first width emitted from at least one first laser beam irradiation apparatus, and simultaneously removes a material from a second region other than the first region on the substrate with a second laser beam having a second width wider than the first width, the second laser beam emitted from at least one second laser beam irradiation apparatus.

5. The method of claim 1, wherein removing the ohmic contact layer pattern comprises repeatedly irradiating the ohmic contact layer pattern with a third laser beam whose power is gradually decreased, wherein the third laser beam is emitted from at least one third laser beam irradiation apparatus.

6. The method of claim 2, wherein the first to third electrical-connection steps are sequentially performed using fourth to sixth laser beams respectively emitted for the first to third electrical-connection steps by at least one fourth laser beam irradiation apparatus.

7. The method of claim 2, wherein at least two of the first to third electrical-connection steps are simultaneously performed using a fourth laser beam emitted for the first electrical-connection step by at least one fourth laser beam irradiation apparatus, a fifth laser beam emitted for the second electrical-connection step by at least one fifth laser beam irradiation apparatus, and a sixth laser beam emitted for the third electrical-connection step by at least one sixth laser beam irradiation apparatus.

8. The method of claim 3, wherein forming the contact hole sequentially forms the first to third contact holes using the fourth to sixth laser beams respectively emitted for the first to third contact holes by at least one fourth laser beam irradiation apparatus.

9. The method of claim 3, wherein forming the contact hole simultaneously forms at least two of the first to third contact holes using a fourth laser beam emitted for the first contact hole by at least one fourth laser beam irradiation apparatus, a fifth laser beam emitted for the second contact hole by at least one fifth laser beam irradiation apparatus, and a sixth laser beam emitted for the third contact hole by at least one sixth laser beam irradiation apparatus.

10. An apparatus of fabricating a TFT array substrate comprising:
a gate material forming part for forming a gate material on an entire surface of a substrate;
a gate material pattern forming part for patterning the gate material to form a gate pattern including a gate line, a gate electrode pattern and a gate pad electrode pattern;
a gate insulating layer forming part for forming a gate insulating layer on the entire surface of the substrate including the gate pattern;
a semiconductor material forming part for forming a semiconductor material including a semiconductor layer and an ohmic contact layer on the gate insulating layer;
a semiconductor material pattern forming part for patterning the semiconductor layer and the ohmic contact layer to form a semiconductor material pattern including a semiconductor layer pattern and an ohmic contact layer pattern above the gate electrode pattern;
a data material forming part for forming a data material on the entire surface of the substrate including the semiconductor layer pattern;
a data material pattern forming part for patterning the data material to form a data material pattern including a data line, a data pad electrode pattern, a source electrode pattern and a drain electrode pattern on the ohmic contact layer pattern at a predetermined interval from each other;
an ohmic contact layer removing part for removing the ohmic contact layer exposed between the source and drain electrode patterns; and
a passivation layer forming part for forming a passivation layer on the entire surface of the substrate from which the ohmic contact layer exposed between the source and drain electrode patterns is removed,
wherein at least one of the gate material pattern forming part, the semiconductor material pattern forming part, the data material pattern forming part and the ohmic contact layer removing part forms the corresponding pattern by a first laser scribing process using at least one laser beam.

11. The apparatus of claim 10, further comprising:
a conductive material forming part for forming a conductive material on the passivation layer;
a conductive material pattern forming part for patterning the conductive material to form a pixel electrode pattern, a gate pad pattern and a data pad pattern; and
an electrical-connection performing part for performing a first electrical-connection step to electrically connect the pixel electrode pattern with the source electrode pattern, a second electrical-connection step to electrically connect the gate pad pattern with the gate pad electrode pattern, and a third electrical-connection step to electrically connect the data pad pattern with the data pad electrode pattern,
wherein at least of the conductive material pattern forming part and the electrical-connection performing part forms the corresponding pattern by a second laser scribing process using a laser beam.

12. The apparatus of claim 10, further comprising:
a contact hole forming part for forming first, second and third contact holes in the passivation layer, wherein the first contact hole exposes the source electrode pattern, the second contact hole exposes the gate pad electrode pattern, and the third contact hole exposes the data pad electrode pattern;

a conductive material forming part for forming a conductive material on the passivation layer including the first to third contact holes; and a conductive material pattern forming part for forming a pixel electrode pattern, a gate pad pattern and a data pad pattern, wherein the pixel electrode pattern is electrically connected with the source electrode pattern through the first contact hole, the gate pad pattern is electrically connected with the gate pad electrode pattern through the second contact hole, and the data pad pattern is electrically connected with the data pad electrode pattern through the third contact hole, wherein at least one of the contact hole forming part and the conductive material pattern forming part forms the corresponding pattern by a second laser scribing process using a laser beam.

13. The apparatus of claim 11, wherein at least one of the gate material pattern forming part, the semiconductor material pattern forming part, the data material pattern forming part and the conductive material pattern forming part patterns a material in a first region on the substrate with a first laser beam having a first width emitted from at least one first laser beam irradiation apparatus, and simultaneously removes a material from a second region other than the first region on the substrate with a second laser beam having a width to be wider than the first width, the second laser beam emitted from at least one second laser beam irradiation apparatus.

14. The apparatus of claim 10, wherein the ohmic contact layer pattern forming part removes the ohmic contact layer pattern by repeatedly irradiating the ohmic contact layer pattern with a third laser beam whose power is gradually decreased, wherein the third laser beam is emitted from at least one third laser beam irradiation apparatus.

15. The apparatus of claim 11, wherein the electrical-connection performing part sequentially performs the first to third electrical-connection steps using fourth to sixth laser beams respectively emitted for the first to third electrical-connection steps by at least one fourth laser beam irradiation apparatus.

16. The apparatus of claim 11, wherein the electrical-connection performing part simultaneously performs at least two of the first to third electrical-connection steps using a fourth laser beam emitted for the first electrical-connection step by at least one fourth laser beam irradiation apparatus, a fifth laser beam emitted for the second electrical-connection step by at least one fifth laser beam irradiation apparatus, and a sixth laser beam emitted for the third electrical-connection step by at least one sixth laser beam irradiation apparatus.

17. The apparatus of claim 12, wherein the contact hole forming part sequentially performs the first to third contact holes using the fourth to sixth laser beams respectively emitted for the first to third contact holes by at least one fourth laser beam irradiation apparatus.

18. The apparatus of claim 12, wherein the contact hole forming part simultaneously performs at least two of the first to third contact holes using a fourth laser beam emitted for the first contact hole by at least one fourth laser beam irradiation apparatus, a fifth laser beam emitted for the second contact hole by at least one fifth laser beam irradiation apparatus, and a sixth laser beam emitted for the third contact hole by at least one sixth laser beam irradiation apparatus.

19. The method of claim 3, wherein at least one of patterning the gate material, patterning the semiconductor layer and the ohmic contact layer, patterning the data material, and patterning the conductive material patterns a material in a first region on the substrate with a first laser beam having a first width emitted from at least one first laser beam irradiation apparatus, and simultaneously removes a material from a second region other than the first region on the substrate with a second laser beam having a width wider than the first width, the second laser beam emitted from at least one second laser beam irradiation apparatus.

20. The apparatus of claim 12, wherein at least one of the gate material pattern forming part, the semiconductor material pattern forming part, the data material pattern forming part and the conductive material pattern forming part patterns a material in a first region on the substrate with a first laser beam having a first width emitted from at least one first laser beam irradiation apparatus, and simultaneously removes a material from a second region other than the first region on the substrate with a second laser beam having a width wider than the first width, the second laser beam emitted from at least one second laser beam irradiation apparatus.

* * * * *